(12) United States Patent
Chang et al.

(10) Patent No.: US 12,721,173 B2
(45) Date of Patent: Aug. 25, 2026

(54) SEAL RINGS IN INTEGRATED CIRCUIT PACKAGE AND METHOD

(71) Applicant: Taiwan Semiconductor Manufacturing Co., Ltd., Hsinchu (TW)

(72) Inventors: Hung-Pin Chang, New Taipei (TW); Cheng-Hsien Hsieh, Kaohsiung (TW); Li-Han Hsu, Hsinchu (TW); Wei-Cheng Wu, Hsinchu (TW); Der-Chyang Yeh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 317 days.

(21) Appl. No.: 18/452,257

(22) Filed: Aug. 18, 2023

(65) Prior Publication Data

US 2024/0413101 A1 Dec. 12, 2024

Related U.S. Application Data

(60) Provisional application No. 63/506,851, filed on Jun. 8, 2023.

(51) Int. Cl.
*H10W 42/00* (2026.01)
*H10W 74/01* (2026.01)
(Continued)

(52) U.S. Cl.
CPC ......... *H10W 42/00* (2026.01); *H10W 74/014* (2026.01); *H10W 74/117* (2026.01); *H10W 90/00* (2026.01); *H10W 80/312* (2026.01); *H10W 80/327* (2026.01); *H10W 90/794* (2026.01)

(58) Field of Classification Search
CPC . H10W 42/00; H10W 74/014; H10W 74/117; H10W 90/00; H10W 80/312; H10W 80/327; H10W 90/794; H10W 90/297; H10W 42/121; H10W 70/05; H10W 70/685; H10W 74/012;
(Continued)

(56) References Cited

U.S. PATENT DOCUMENTS 8,048,778 B1 * 11/2011 Ku .......................... H10P 54/00 257/E21.599
8,993,380 B2 3/2015 Hou et al.
(Continued)

FOREIGN PATENT DOCUMENTS

KR 20220015305 A 2/2022
TW 202221885 A 6/2022
(Continued)

*Primary Examiner* — Yasser A Abdelaziez
(74) *Attorney, Agent, or Firm* — Slater Matsil, LLP

(57) ABSTRACT

In an embodiment, a package includes an integrated circuit die comprising a first insulating bonding layer and a first semiconductor substrate and an interposer comprising a second insulating bonding layer, a first seal ring, and a second semiconductor substrate. The second insulating bonding layer is directly bonded to the first insulating bonding layer with dielectric-to-dielectric bonds, and wherein the integrated circuit die overlaps the first seal ring. A sidewall of the integrated circuit die is exposed at an outer sidewall of the package.

20 Claims, 22 Drawing Sheets

(51) Int. Cl.
*H10W 74/10* (2026.01)
*H10W 90/00* (2026.01)
*H10W 80/00* (2026.01)

(58) Field of Classification Search
CPC . H10W 74/114; H10W 74/131; H10W 70/65; H10P 72/74; H10P 54/00
See application file for complete search history.

(56) References Cited

U.S. PATENT DOCUMENTS

| | | | | |
|---|---|---|---|---|
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 11,177,142 | B2 * | 11/2021 | Huang | H10W 74/014 |
| 2014/0035093 | A1 * | 2/2014 | Pincu | H10D 84/01 438/618 |
| 2016/0233175 | A1 * | 8/2016 | Dubey | H10W 42/121 |
| 2020/0310052 | A1 * | 10/2020 | Lim | G02B 6/4255 |
| 2021/0313281 | A1 * | 10/2021 | Kaminaga | H10W 42/00 |
| 2021/0375846 | A1 * | 12/2021 | Chen | H10P 54/00 |
| 2022/0037268 | A1 | 2/2022 | Shen et al. | |
| 2022/0068736 | A1 | 3/2022 | Lo et al. | |
| 2022/0189861 | A1 | 6/2022 | Aleksov et al. | |
| 2022/0192042 | A1 | 6/2022 | Kabir et al. | |
| 2022/0301981 | A1 | 9/2022 | Chang et al. | |

FOREIGN PATENT DOCUMENTS

| | | | |
|---|---|---|---|
| TW | 202224037 | A | 6/2022 |
| TW | 202230540 | A | 8/2022 |

* cited by examiner 110
110'
70
100'
80B
112
X'
X
46
L3
110'
62'
T1
80A
60
56
52
76
54
58
78
74
72
50

62'
70
80B
80A
80
100B
50B
58
56
98
50A
82
70F
70B
100A
60
76
114
110
78
74
72

62'
70
80B
80A
80
100B
50B
58
56
50A
82
98
70B
60
100A
76
114
110
78
74
72
116

SEAL RINGS IN INTEGRATED CIRCUIT PACKAGE AND METHOD

PRIORITY CLAIM AND CROSS-REFERENCE

This application claims the benefits of U.S. Provisional Application No. 63/506,851, filed on Jun. 8, 2023, which application is hereby incorporated herein by reference in its entirety.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional package that includes multiple chips. Other packages have also been developed to incorporate three-dimensional aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
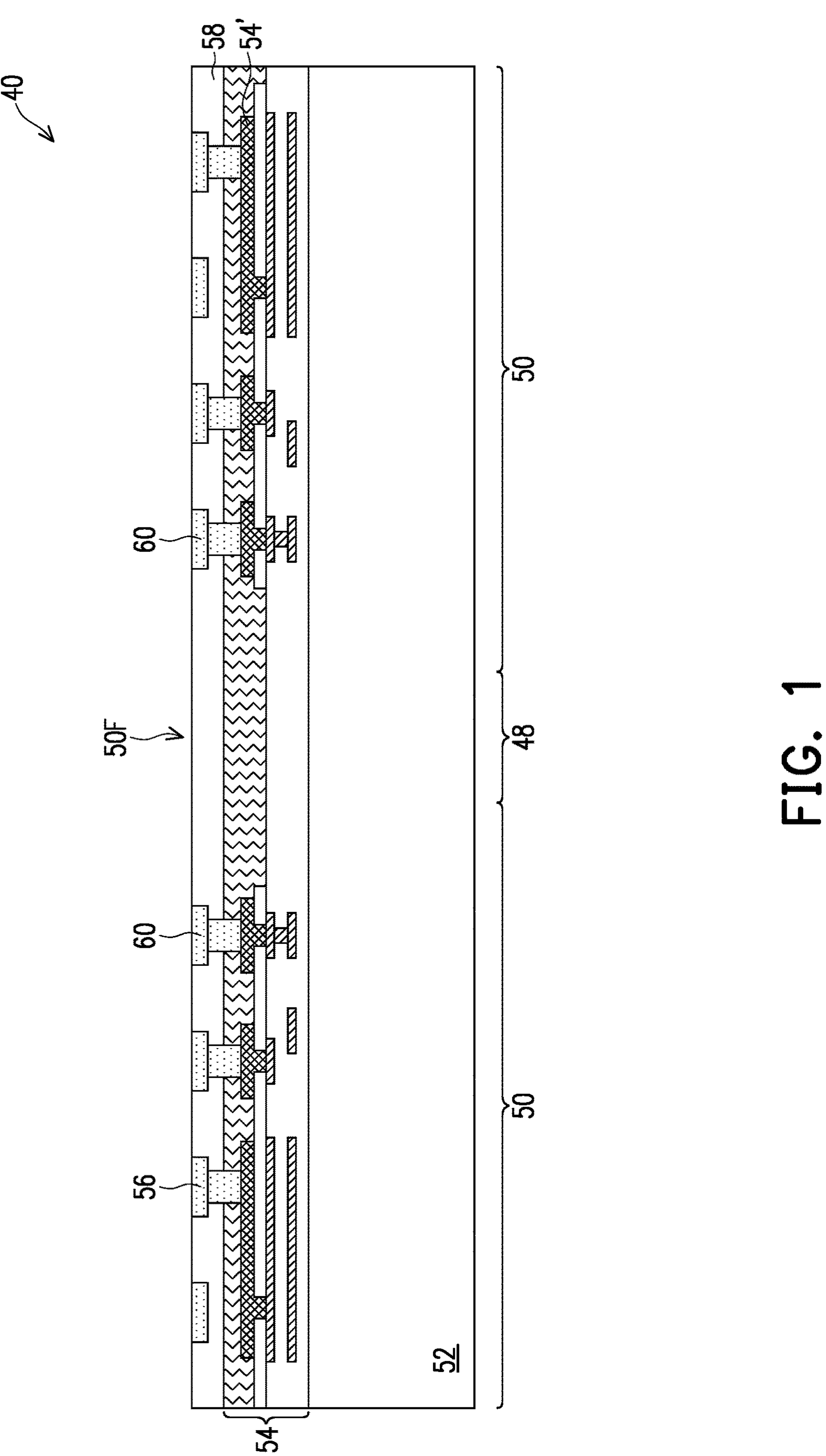
FIGS. 1, 2, 3, 4, 5, 6A, 6B, 7A, 7B, 7C, 7D, 8, 9, 10, 11A, 11B, 12A, 12B, 12C, 12D, 13A and 13B illustrate varying views of various intermediate stages of manufacturing a semiconductor package according to various embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, integrated circuit packages are formed by directly bonding integrated circuit dies to a wafer that contains another device, such as an interposer, and a molding compound is dispensed around the integrated circuit dies as an encapsulant. Then, a singulation process is performed that dices through the interposer and the integrated circuit dies. For example, sacrificial zones along peripheries of the integrated circuit dies and the interposer may be included in the device designs such that no functional circuitry is formed in these sacrificial zones. The singulation process may then be performed to dice through the sacrificial zones. In some embodiments, the sacrificial zone of the interposer may be defined by one or more seal rings, and at least one of the seal rings is disposed directly under the integrated circuit dies.

In this manner, a molding compound around an outer periphery of the integrated circuit dies and excess overhang of the interposer is removed, advantageously reducing stress in the resulting package. For example, excess overhang in the bottom interposer can result in excess bending during operation from changing temperature conditions, which degrades bonding interfaces of the package. By reducing or eliminating excess overhang in the bottom interposer, stress in the bonded package can be relaxed (e.g., reducing undesired bending). It has been observed that stress can be reduced by up to 84% in high temperature operating conditions and reduced by up to 97% in low temperature operating conditions in packages that result from embodiment singulation methods.

FIG. 1 is a cross-sectional view of a wafer 40, which includes integrated circuit dies 50. The integrated circuit dies 50 will be packaged in subsequent processing to form integrated circuit packages. Each integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or combinations thereof (e.g., a system-on-a-chip (SoC) die). The integrated circuit dies 50 may be formed in the wafer 40, which may include different device regions that are singulated in subsequent steps to form a plurality of integrated circuit dies 50. Specifically, the device regions may be separated by scribe line regions 48 in which the subsequent singulation process is performed. The integrated circuit dies 50 each include a semiconductor substrate 52, an interconnect structure 54, and bond pads 56 disposed in an insulating bonding layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward) and an inactive surface (e.g., the surface facing downward). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form one or more integrated circuits. The interconnect structure 54 may include one or more dielectric layer(s) and respective metallization pattern(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization patterns may include conductive vias and/or conductive lines to interconnect the devices of the semiconductor substrate 52. The metallization patterns may be formed of a conductive material, such as a metal, such as copper, cobalt, aluminum, gold, combinations thereof, or the like. The interconnect structure 54 may be formed by a damascene process, such as a single damascene process, a dual damascene process, or the like. The interconnect structure 54 may further include metal pads 54', which are connected to a top-most metallization pattern of the interconnect structure 54 through one or more passivation layers. An additional insulating layer (e.g., a passivation layer) may be formed around the metal pads 54' to provide a planar surface on which to form the overlaying insulating bonding layer 58.

Bond pads 56 are at the front side of the integrated circuit die 50. The bond pads 56 may be conductive pillars, pads, or the like, to which external connections are made. The bond pads 56 can be formed of a metal, such as copper, aluminum, or the like, and can be formed by, for example, plating, or the like. In some embodiments, the bond pads 56 may be electrically connected to conductive features of the interconnect structure 54 (e.g., the metal pads 54') by conductive vias (sometimes referred to as bond pad vias). The integrated circuit dies 50 further include one or more seal rings 60 at peripheries of each of the integrated circuit dies 50. Each of the seal rings 60 may be disposed in a loop (see e.g., FIG. 6B) that encircles respective bond pads 56 and functional metallization patterns in the interconnect structure 54 of each of the integrated circuit dies 50. The seal rings 60 may include bond pad portions at a same level as the bond pads 56 and metallization patterns in the interconnect structure 54 that are all vertically stacked and connected together by conductive vias, for example. As will be explained in greater detail subsequently, the seal rings 60 may further act as a boundary of a sacrificial zone that will be removed in singulation processes after directly bonding the integrated circuit die to another package component (e.g., an interposer). As such, the integrated circuit dies 50 may not include any metallization patterns and/or bond pads 56 outside of the seal rings 60.

The bond pads 56 may be disposed in an insulating bonding layer 58 at the front side 50F of the integrated circuit die 50. The insulating bonding layer 58 may be made of a material suitable for subsequent dielectric-to-dielectric bonding, such as, silicon oxide, silicon oxynitride, or the like. The insulating bonding layer 58 may be deposited on the interconnect structure, for example, by spin coating, lamination, chemical vapor deposition (CVD), or the like. The bond pads 56 may be formed in the insulating bonding layer with a damascene process for example, and a planarization process (e.g., a chemical mechanical polish (CMP) or the like) may be performed such that top surfaces of the bond pads 56 and the insulating bonding layer 58 are coplanar (within process variations) and are exposed at the front side 50F of the integrated circuit die 50. As will be described in greater detail below, the planarized front side 50F of the integrated circuit die 50 will be directly bonded to another package component, such as an interposer.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias or through-silicon vias (TSVs). Each of the semiconductor substrates 52 may (or may not) have a separate interconnect structure 54.

Figure 2:
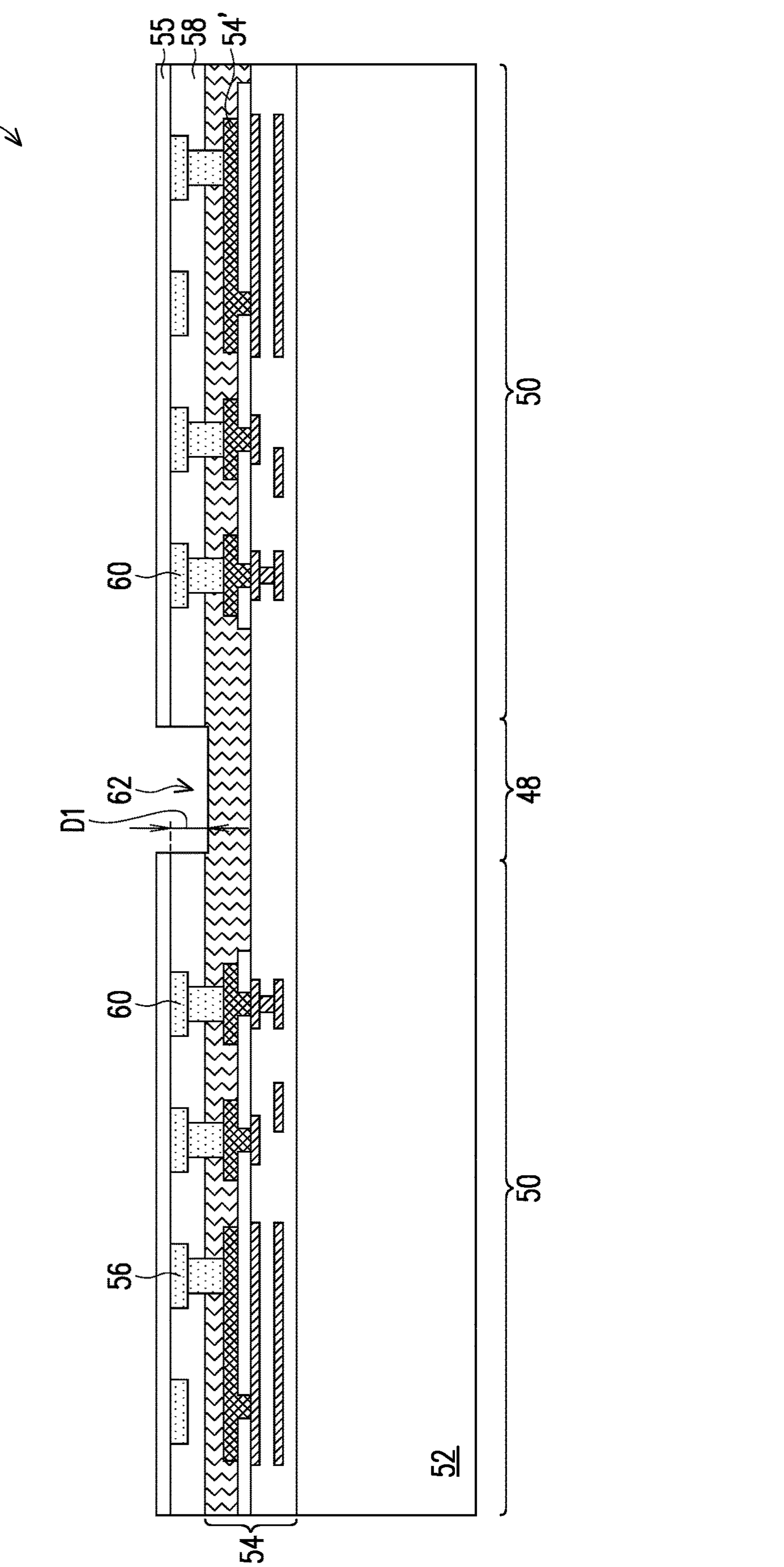
Figure 3:
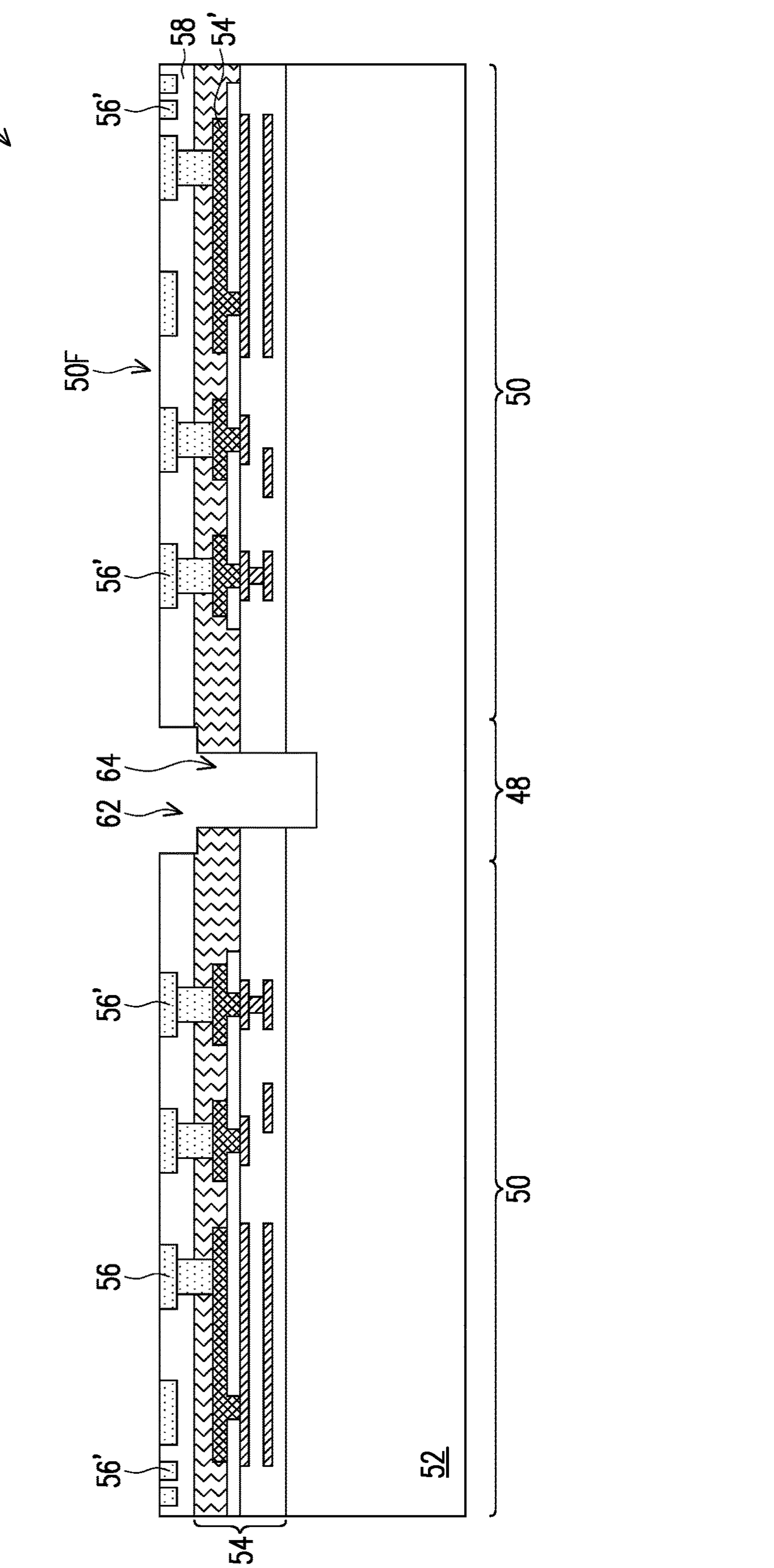
Figure 4:
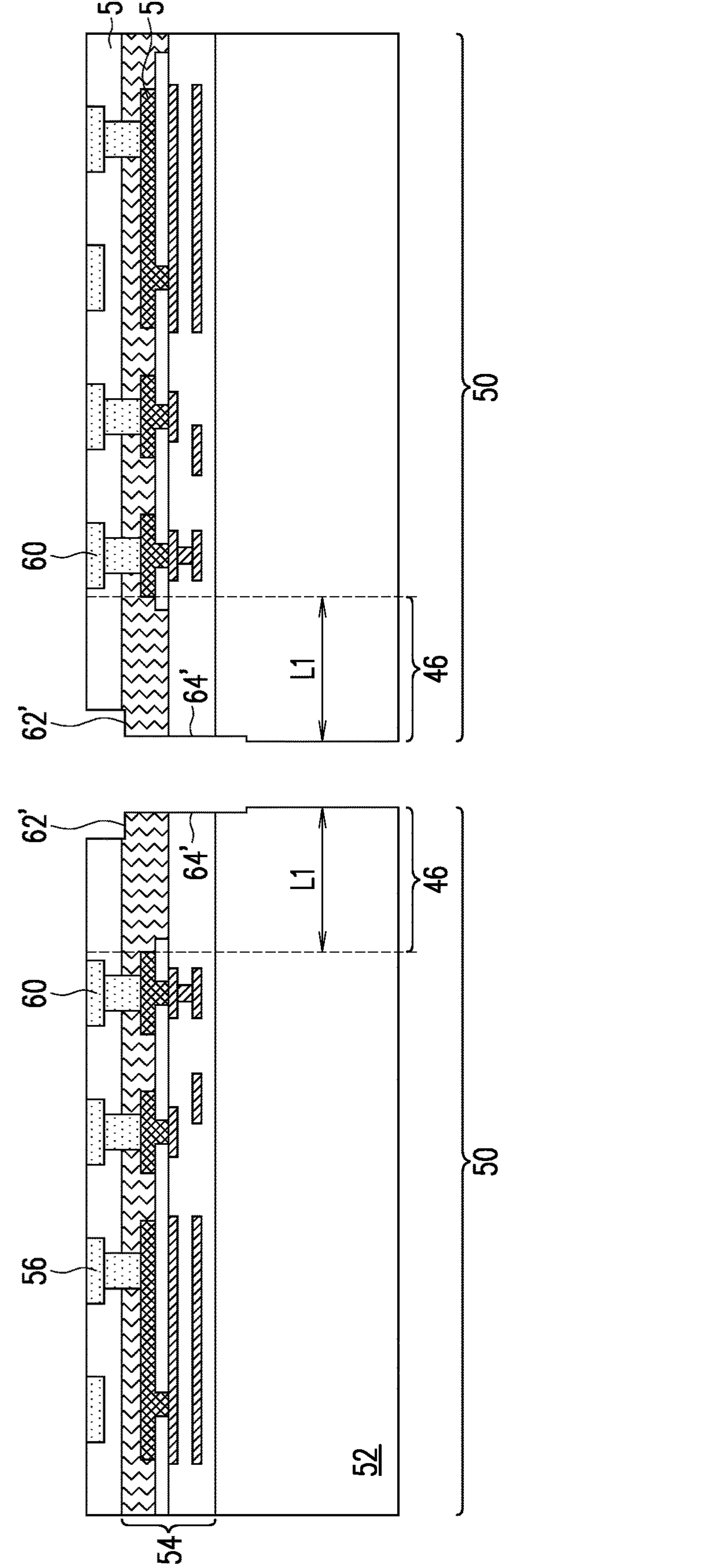

FIGS. 2 through 4 are varying views of intermediate steps during a singulation process to separate the integrated circuit dies 50 from the wafer 40. Starting with FIGS. 2, a relatively shallow recess 62 is optionally formed in the insulating bonding layer 58 in the scribe line region 48 between adjacent integrated circuit dies 50.

In some embodiments, the shallow recess 62 is formed with a plasma dicing process in the scribe line regions 48. The plasma dicing process may include forming a patterned mask 55, which may be a photomask patterned by lithography, or the like. The plasma dicing process etches portions of the insulating bonding layer 58 exposed by the patterns (e.g., openings) in the patterned mask 55. As illustrated in FIG. 2, the shallow recess 62 extends into the insulating bonding layer 58. In some embodiments, the shallow recess 62 extends through the insulating bonding layer 58 and may further extend into dielectric layers of interconnect structure 54. However, the shallow recess 62 does not extend into the semiconductor substrate 52 because the recess 62 is relatively shallow. For example, a bottom surface of the recess 62 may be above a top surface of the semiconductor substrate 52. In some embodiments, a depth D1 that the recess 62 extends may be in a range of 5kÅ to 2.5 μm. Because the relatively shallow recess 62 does not extend into the semiconductor substrate 52, the integrated circuit dies 50 can be readily adhered to an underlying component (e.g., an interposer) by an encapsulant as will be explained subsequently. In some embodiments, the plasma dicing is a dry plasma process such as Reactive Ion Etching (RIE) using a fluorine-based plasma, an argon-based plasma, an oxygen-based plasma, a nitrogen-based plasma, or the like.

In FIG. 3, an optional grooving process is performed to define a groove 64 in the scribe line region 48 between adjacent integrated circuit dies 50. The grooving process may be performed through the recess 62, so that the groove 64 is connected to the recess 62. The groove 64 may extend from the recess 62 into the semiconductor substrate 52. In some embodiments, the grooving process may be a laser grooving process, another plasma dicing process (e.g., a deep plasma dicing process), or the like. The groove 64 may be less narrow than the recess 62.

In FIG. 4, a sawing process is performed to fully separate the integrated circuit dies 50 from each other and the wafer 40. The sawing process may be performed through the recess 62 and the groove 64 (if present) in the scribe line region 48. In some embodiments, the sawing process is a mechanical process using a saw blade that is placed in the recess 62 and the groove 64 to saw through the remaining semiconductor substrate 52. Other sawing processes may be used in other embodiments.

After the sawing process, each singulated, integrated circuit die 50 includes an optional ledge 62' (corresponding to a location of the recess 62) and/or an optional ledge 64' (corresponding to a location of the groove 64). Due to differences in the plasma dicing process and the sawing process, surfaces of different regions of the integrated circuit die 50 may have different roughnesses. For example, surfaces of the ledge 62' (sidewalls of the insulating bonding layer 58), which are formed by plasma dicing, may be smoother than sidewalls of the semiconductor substrate 52, which are formed by mechanical sawing. The ledge 62' provides an artificially delaminated surface, which can be adhered to an underlying package component by a subsequently formed molding compound (see FIGS. 7B-7C) to adventurously reduce delamination defects in the bonded structure.

After singulation, each of the integrated circuit dies 50 includes a sacrificial zone 46 extending from the seal ring 60 to outer sidewalls of the integrated circuit die 50. The sacrificial zone 46 is free of any functional circuitry (e.g., free of any metallization patterns in the interconnect structure 54 or bond pads 56), and the size of the sacrificial zone 46 may be defined in the design rules for a layout file corresponding to the integrated circuit dies 50 so that no active circuitry is disposed in the sacrificial zone 46. As such, a subsequent singulation process (see FIGS. 11A through 12D) may be performed through the sacrificial zone 46 to remove at least a portion of the sacrificial zone 46. In various embodiments, a lateral dimension L1 of the sacrificial zone (e.g., a lateral dimension measured from the seal ring 60 to the outer sidewall of the integrated circuit die 50) may be in a range of 3 μm to 100 μm. It has been observed that when the lateral dimension L1 of the sacrificial zone 46 is less than 3 μm, there is insufficient space for the subsequent singulation process to be performed, and the various benefits of the singulation process described below are not achieved. It has been observed that when the lateral dimension L1 of the sacrificial zone 46 is more than 100 μm, the remaining space in the integrated circuit dies 50 for functional circuitry is unacceptably low.

Although FIGS. 2 through 4 illustrate a particular method of singulating the integrated circuit dies 50, it should be understood that other singulation processes may be used in other embodiments. For example, the plasma dicing process of FIG. 2 and/or the laser grooving process of FIG. 3 may be excluded. In such embodiments, the ledges 62' and/or 64' may likewise be excluded.

FIGS. 5 through 13B are cross-sectional views of intermediate steps during a process for forming integrated circuit packages, in accordance with some embodiments. Details of the integrated circuit dies 50 may be simplified in FIGS. 5 through 13B for ease of illustration. FIGS. 5 through 13B illustrate a particular package configuration, but it should be appreciated that other package configurations may be used as well.

In FIGS. 5 through 10, integrated circuit packages 100 are formed by bonding integrated circuit dies 50 to a wafer 70. The wafer 70 has package regions 100A, 100B, which each include devices formed therein, such as interposers. In FIGS. 11A through 12D, the package regions 100A, 100B are singulated to form integrated circuit packages 100 that each include a singulated portion of the wafer 70 (e.g., an interposer 140) and the integrated circuit dies 50 that are bonded to the singulated portion of the wafer 70. In FIGS. 13A and 13B, the integrated circuit packages 100 are then mounted to a package substrate 200.

Figure 5:
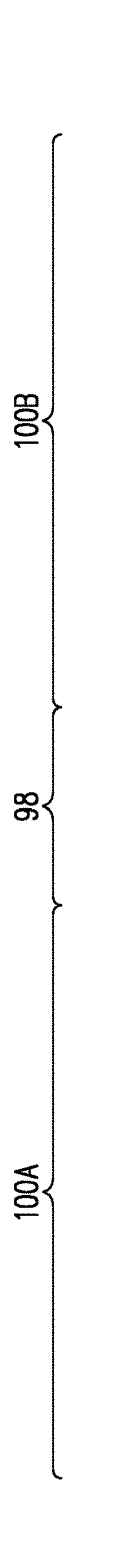
Figure 5:
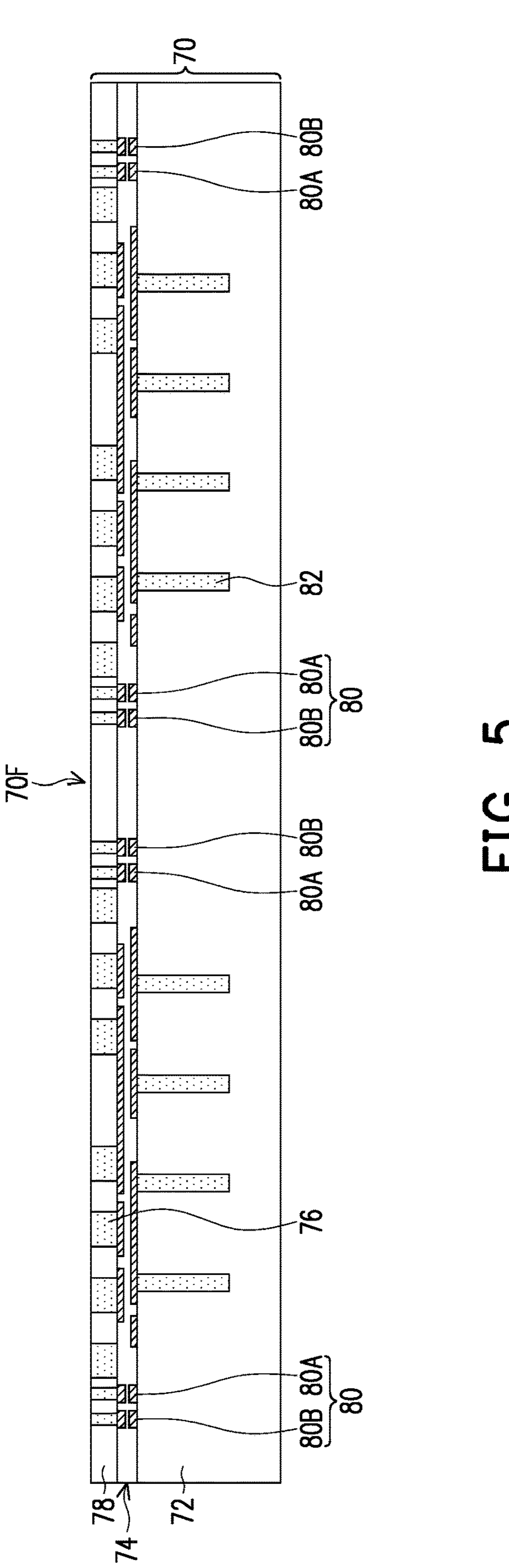

Referring first to FIG. 5, a wafer 70 is illustrated. The wafer 70 comprises devices in the package regions 100A, 100B, which will be singulated in scribe line regions 98 in subsequent processing to be included in the integrated circuit packages 100. The scribe line region 98 is disposed between the package regions 100A, 100B. The devices formed in the wafer 70 may be interposers, integrated circuits dies, or the like. The wafer 70 includes a substrate 72, an interconnect structure 74, bond pads 76, an insulating bonding layer 78, seal rings 80 (including seal rings 80A and 80B), and conductive vias 82.

The substrate 72 may be a bulk semiconductor substrate, a semiconductor-on-insulator (SOI) substrate, a multi-layered semiconductor substrate, or the like. The substrate 72 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 72 may be doped or undoped. In embodiments where passive interposers are formed in the wafer 70, the substrate 72 generally does not include active devices therein, although the passive interposers may include passive devices formed in and/or on a front surface (e.g., the surface facing upward) of the substrate 72. In embodiments where active interposers (also referred to as integrated circuits dies) are formed in the wafer 70, active devices such as transistors, capacitors, resistors, diodes, and the like, may be formed in and/or on the front surface of the substrate 72.

The interconnect structure 74 is over the front surface of the substrate 72, and is used to electrically connect the devices (if any) of the substrate 72. The interconnect structure 74 may include one or more dielectric layer(s) and respective metallization pattern(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization patterns may include conductive vias and/or conductive lines to interconnect any devices together and/or to an external device. The metallization patterns may be formed of a conductive material, such as a metal, such as copper, cobalt, aluminum, gold, combinations thereof, or the like. The interconnect structure 74 may be formed by a damascene process, such as a single damascene process, a dual damascene process, or the like.

Bond pads 76 are at the front side 70F of the wafer 70. The bond pads 76 may be conductive pillars, pads, or the like, to which external connections are made. The bond pads 76 can be formed of a metal, such as copper, aluminum, or the like, and can be formed by, for example, plating, or the like. In some embodiments, the bond pads 76 may be electrically connected to conductive features of the interconnect structure 74 by conductive vias (sometimes referred to as bond pad vias, not explicitly illustrated). The wafer further includes seal rings 80 (including seal rings 80A and 80B) at peripheries of each of the integrated circuit dies 50. Each of the seal rings 80 may be disposed in a loop (see e.g., FIG. 6B) that encircles respective bond pads 76 and the metallization patterns in the interconnect structure 74 of each of the package regions 100A, 100B. The seal rings 80 may include bond pad portions at a same level as the bond pads 76 and metallization patterns in the interconnect structure 74 that are all vertically stacked and connected together by conductive vias, for example.

As will be explained in greater detail subsequently, the seal rings 80A are functional seal rings that will remain in the singulated, integrated circuit packages 100 (see FIGS. 13A and 13B) to protect the bond pads 76 and the circuitry in the interconnect structure 74. The seal rings 80B (also referred to as dummy seal rings 80B or virtual seal rings 80B) encircle the seal rings 80A, and the seal rings 80B may mark areas in the scribe line region 98 that are removed during subsequent singulation processes (see FIGS. 11A through 12D) after integrated circuit dies are bonded to the wafer 70. By removing excess portions of the wafer 70 (e.g., as demarked by the seal rings 80A and 80B), the resulting interposer may be free of excessive overhang, which advantageously reduces stress in the resulting integrated circuit package. As such, the wafer 70 may not include any metallization patterns, bond pads 76, or conductive vias 82 outside of a footprint of the seal rings 80A in a top-down view. The size and location of the seal rings 80 (and the resulting areas removed by singulation) may be defined in the design rules for a layout file corresponding to the wafer 70 so that no active circuitry is disposed outside of the seal rings 80A.

The bond pads 76 may be disposed in an insulating bonding layer 78 at the front side 70F of the wafer 70. The insulating bonding layer 78 may be made of a material suitable for subsequent dielectric-to-dielectric bonding, such as, silicon oxide, silicon oxynitride, or the like. The insulating bonding layer 78 may be deposited on the interconnect structure, for example, by spin coating, lamination, chemical vapor deposition (CVD), or the like. A material of the insulating bonding layer 78 may be the same or different as the insulating bonding layer 58. For example, in a particular embodiment, one of the insulating bonding layers 58/78 is made of silicon oxide and another one of the insulating bonding layers 58/78 is made of silicon oxynitride. Other combinations are also possible. The bond pads 76 may be formed in the insulating bonding layer 78 with a damascene process for example, and a planarization process (e.g., a chemical mechanical polish (CMP) or the like) may be performed such that top surfaces of the bond pads 76 and the insulating bonding layer 78 are coplanar (within process variations) and are exposed at the front side 70F of the wafer 70.

The conductive vias 82 extend into the substrate 72 and/or the interconnect structure 74. The conductive vias 82 are electrically coupled to metallization patterns of the interconnect structure 74. The conductive vias 82 are also sometimes referred to as TSVs. As an example to form the conductive vias 82, recesses can be formed in the interconnect structure 74 and/or the substrate 72 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed from an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 74 or the substrate 72 by, for example, a CMP. Remaining portions of the barrier layer and conductive material form the conductive vias 82.

Figure 6A:
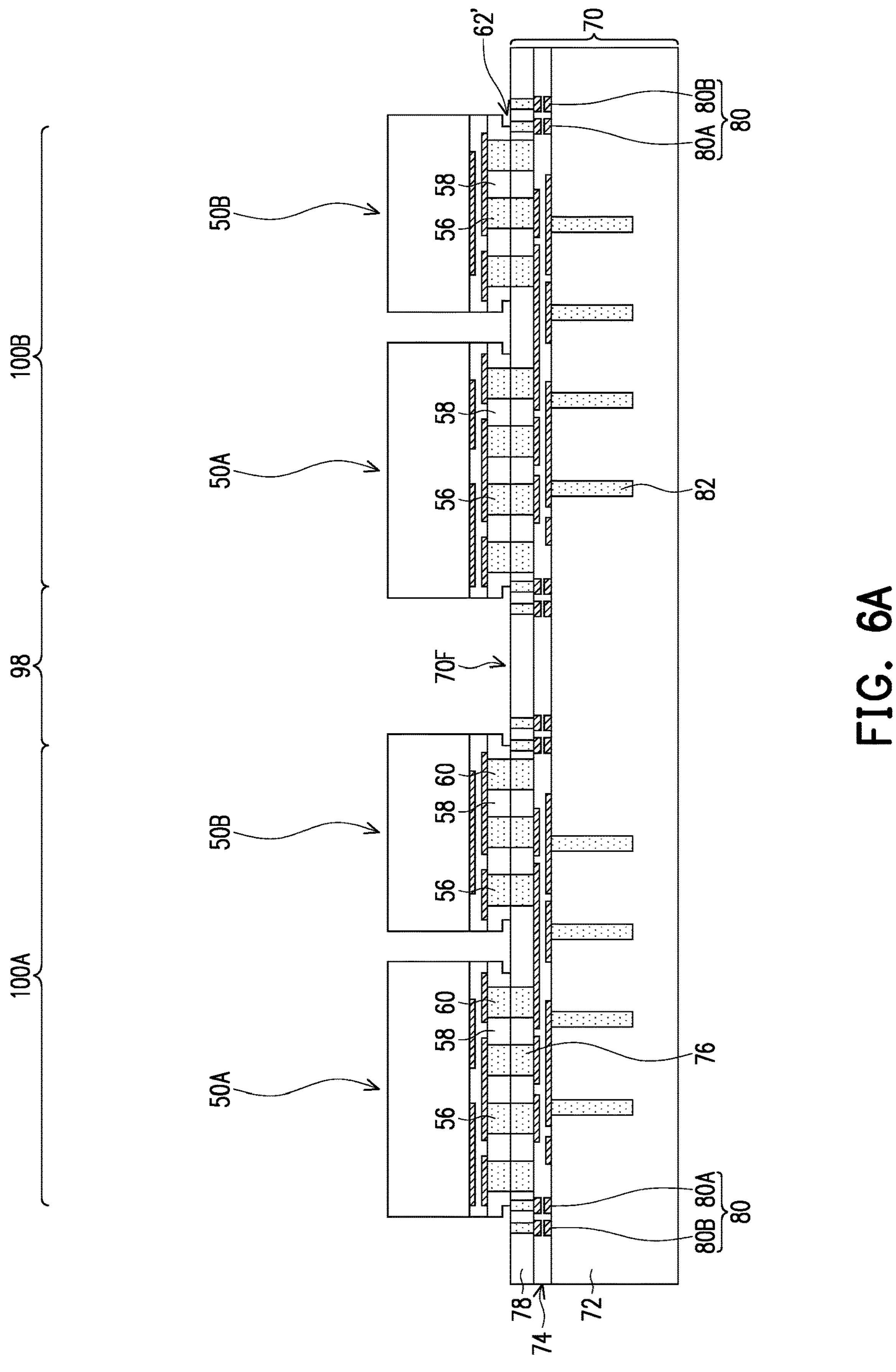
Figure 6B:
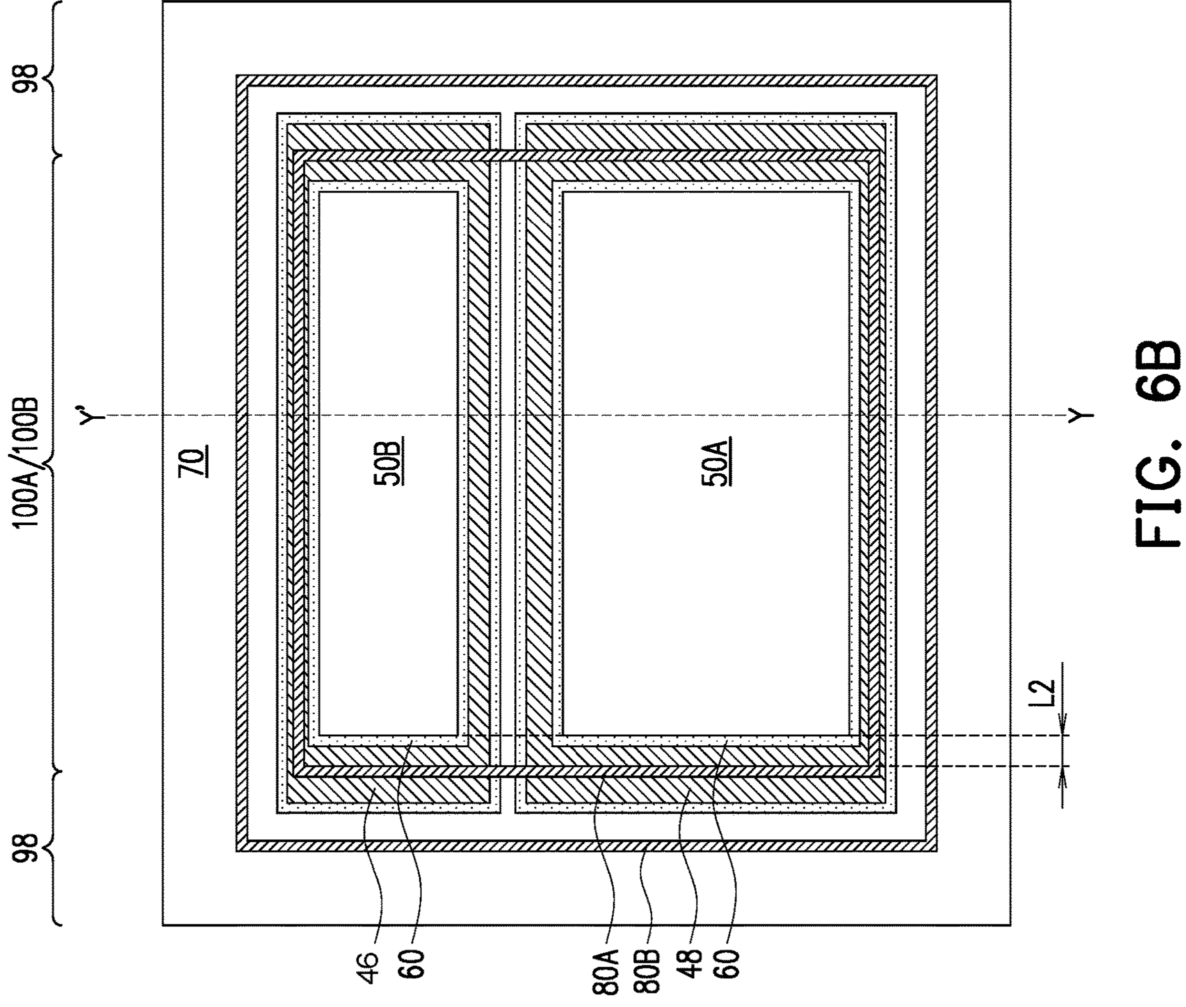

In FIGS. 6A and 6B, integrated circuit dies 50 are bonded to the wafer 70. FIG. 6A illustrates a cross-sectional view, and FIG. 6B illustrates a top down view of a single package region (e.g., the package region 100A or 100B). The cross-sectional view of FIG. 6A is taken along line Y-Y' of FIG. 6B. In this embodiment, the integrated circuit dies 50 include multiple integrated circuit dies 50A, 50B that are placed in each of the package regions 100A, 100B. The integrated circuit dies 50A, 50B may each have a single function (e.g., a logic device, memory device, etc.), or may have multiple functions (e.g., a SoC). Although two integrated circuit dies 50 are illustrated in each package region 100A, 100B, any number of integrated circuit dies 50 may be bonded in each package region 100A, 100B. In another embodiment, a single integrated circuit die 50 is bonded in each of the package regions 100A, 100B. The integrated circuit dies 50 in each package region 100A, 100B may be a same size (have a same footprint and height) or they may be different sizes (having a different footprint and/or height).

The integrated circuit dies 50 and the wafer 70 are directly bonded in a face-to-face manner by a dielectric-to-dielectric bonding and metal-to-metal bonding process (sometimes referred to as hybrid bonding), such that the front sides 50F of the integrated circuit dies 50 are bonded to the front side 70F of the wafer 70. Specifically, the insulating bonding layers 58 of the integrated circuit dies 50 are bonded to the insulating bonding layer 78 of the wafer 70 through dielectric-to-dielectric bonding, without using any adhesive material (e.g., die attach film), and the bond pads 56 of the integrated circuit dies 50 are bonded to the bond pads 76 of the wafer 70 through metal-to-metal bonding, without using any eutectic material (e.g., solder). The bonding may include a pre-bonding and an annealing. During the pre-bonding, a small pressing force is applied to press the integrated circuit dies 50 against the wafer 70. The pre-bonding is performed at a low temperature, such as room temperature, such as a temperature in the range of about 15° C. to about 30° C. The bonding strength of the insulating bonding layers 58, 78 is then improved in a subsequent annealing step, in which the insulating bonding layers 58, 78 are annealed at a high temperature, such as a temperature in the range of about 100° C. to about 450° C. After the annealing, bonds, such as covalent bonds, are formed bonding the insulating bonding layers 58, 78. The bond pads 56, 76 are connected to each other with a one-to-one correspondence. The bond pads 56, 76 may be in physical contact after the pre-bonding, or may expand to be brought into physical contact during the annealing. Further, during the annealing, the material of the bond pads 56, 76 (e.g., copper) intermingles, so that metal-to-metal bonds are also formed. Hence, the resulting bonds between the integrated circuit dies 50 and wafer 70 are hybrid bonds that include both dielectric-to-dielectric bonds and metal-to-metal bonds.

In the illustrated embodiment where the integrated circuit dies 50 include ledges 62', gaps may be disposed in peripheral regions of the integrated circuit dies 50 between the insulating bonding layers 58, 78. For example, sidewalls of the insulating bonding layer 58 may be laterally displaced from an outer sidewall of semiconductor substrate 52, which results in gaps in the bonded structure. The insulating bonding layers 58, 78 may remain not touching and not bonded at peripheries of the integrated circuit dies 50. These gaps allow for a subsequently formed encapsulant to be filled between the insulating bonding layers 58, 78 to improve adhesion, reduce stress, and reduce delamination defects. In other embodiments where the ledges 62' are omitted (see FIGS. 7D and 13B), the gaps may likewise be omitted and the insulating bonding layers 58, 78 may be in physical contact at the peripheries of the integrated circuit dies 50.

As illustrated, the seal rings 80A may be disposed directly under and be overlapped by the integrated circuit dies 50 in each of the package regions 100A, 100B. For example, in the top-down view provided by FIG. 6B, each seal ring 80A may be disposed within a footprint of the sacrificial zones 46, and the seal ring 80A may be overlapped by each of the integrated circuit dies 50A, 50B. In some embodiments, a lateral distance L2 measured from the seal ring 60 to the seal ring 80A in a top-down view may be 0 or more. When the lateral distance L2 is equal to 0, the seal ring 80A may be at least partially overlapped by the seal ring 60 (see, e.g., the embodiment of FIG. 7C). Although FIG. 6B illustrates the lateral distance L2 between the seal ring 80A and the seal ring 60 of the integrated circuit die 50A as being equal to the lateral distance L2 between the seal ring 80A and the seal ring 60 of the integrated circuit die 50B, in other embodiments, a lateral distance between the seal ring 80A and the seal ring 60 of the integrated circuit die 50A may be different than a lateral distance between the seal ring 80A and the seal ring 60 of the integrated circuit die 50B.

Further, the seal rings 80B may be disposed outside of a footprint of the integrated circuit dies 50. For example, the seal ring 80B may encircle the seal ring 80A and all the integrated circuit dies 50 in a package region 100A, 100B in a top-down view. In subsequent processes, a singulation process may be performed between the seal rings 80A and 80B. through the sacrificial zone 46 of the integrated circuit dies 50 and removing the seal ring 80B. In this manner, excess overhang of the resulting interposer may be reduced, which reduces stress in the resulting package.

In FIGS. 7A through 7D, an encapsulant 110 is formed on the various components. The encapsulant 110 is formed of a molding material or compound. The molding material includes a polymer material and optionally includes fillers (e.g., fillers 110', see FIGS. 7B through 7D). The polymer material may be an epoxy or the like. The fillers are formed of a material that provides mechanical strength and thermal dispersion for the encapsulant 110, such as particles of silica ($SiO_2$). The molding material (including the polymer material and/or the fillers) may be formed by compression molding, transfer molding, or the like. The encapsulant 110 may be formed over the front side 70F of the wafer 70 such that the integrated circuit dies 50 are buried or covered. The encapsulant 110 is then cured. A planarization process may be performed to planarize the top surface of the encapsulant 110 and the integrated circuit dies 50. The planarization process may be a CMP, an etch-back, combinations thereof, or the like. In the illustrated embodiment, the integrated circuit dies 50 are exposed by the planarization of the encapsulant 110 such that top surfaces of the integrated circuit dies 50 and the encapsulant 110 are substantially level (within process variations. The planarization may remove portions of the semiconductor substrate 52. The encapsulant 110 surrounds and protects the integrated circuit dies 50.

Figure 7A:
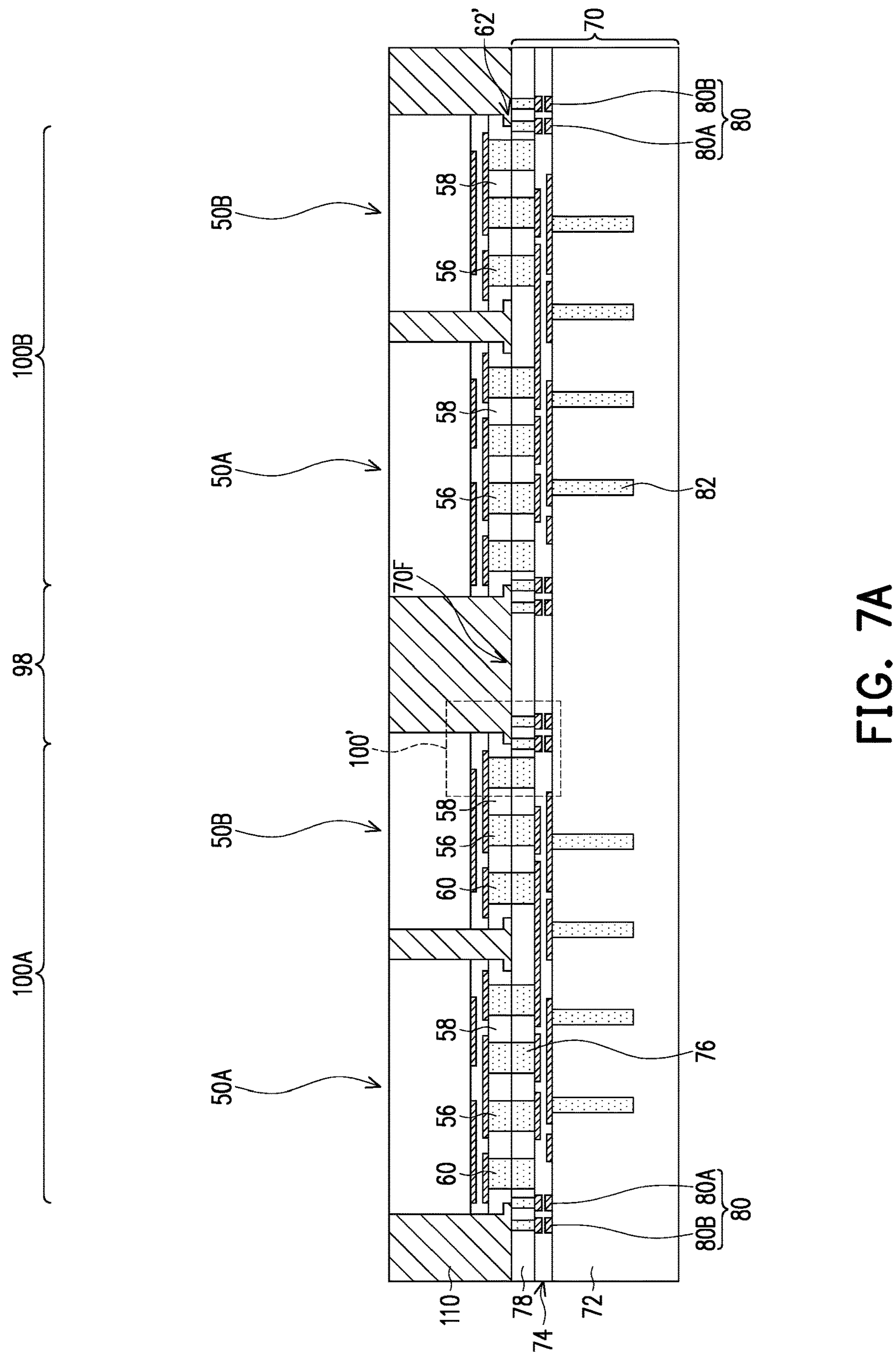
Figure 7B:
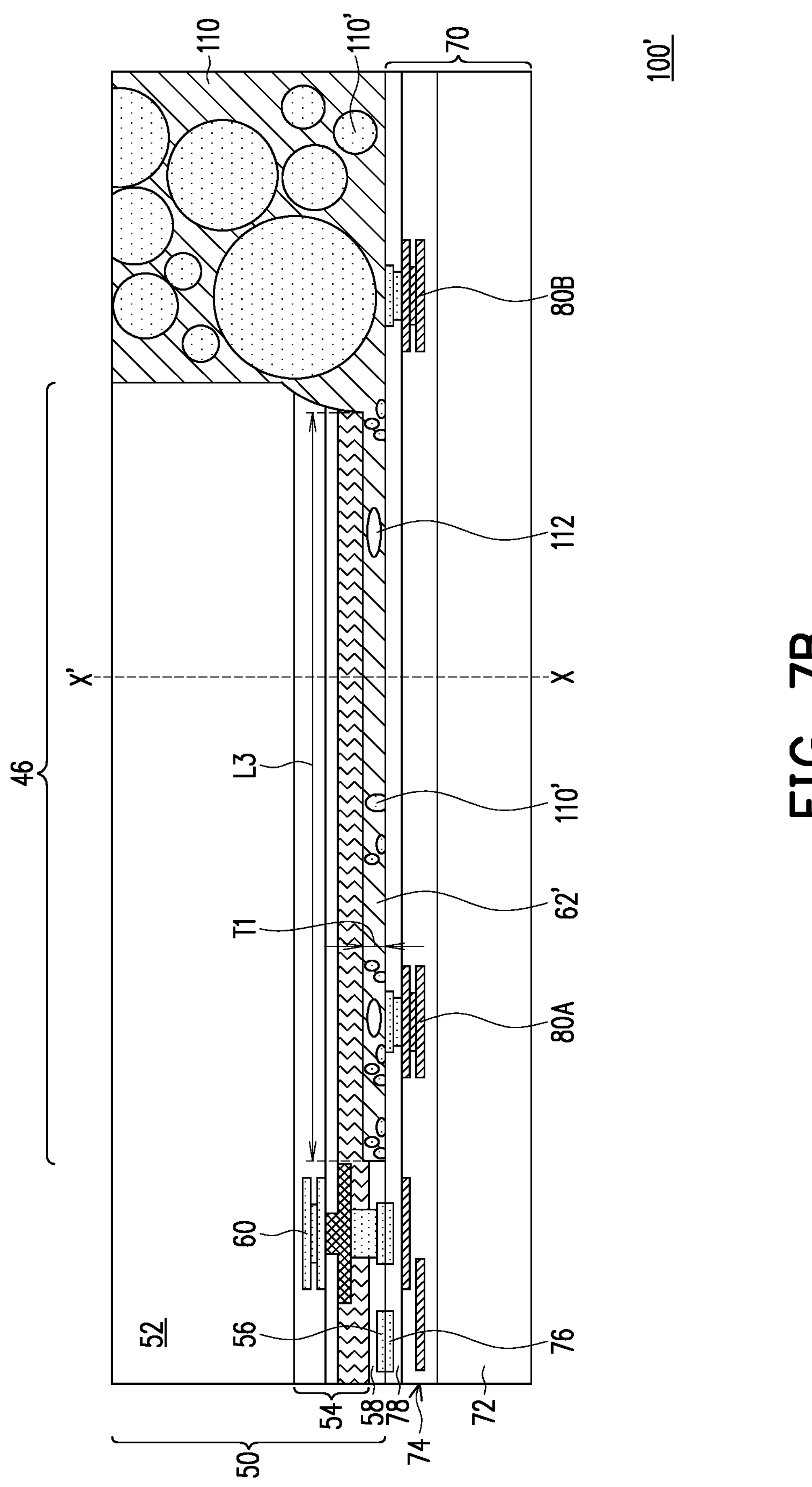
Figure 7C:
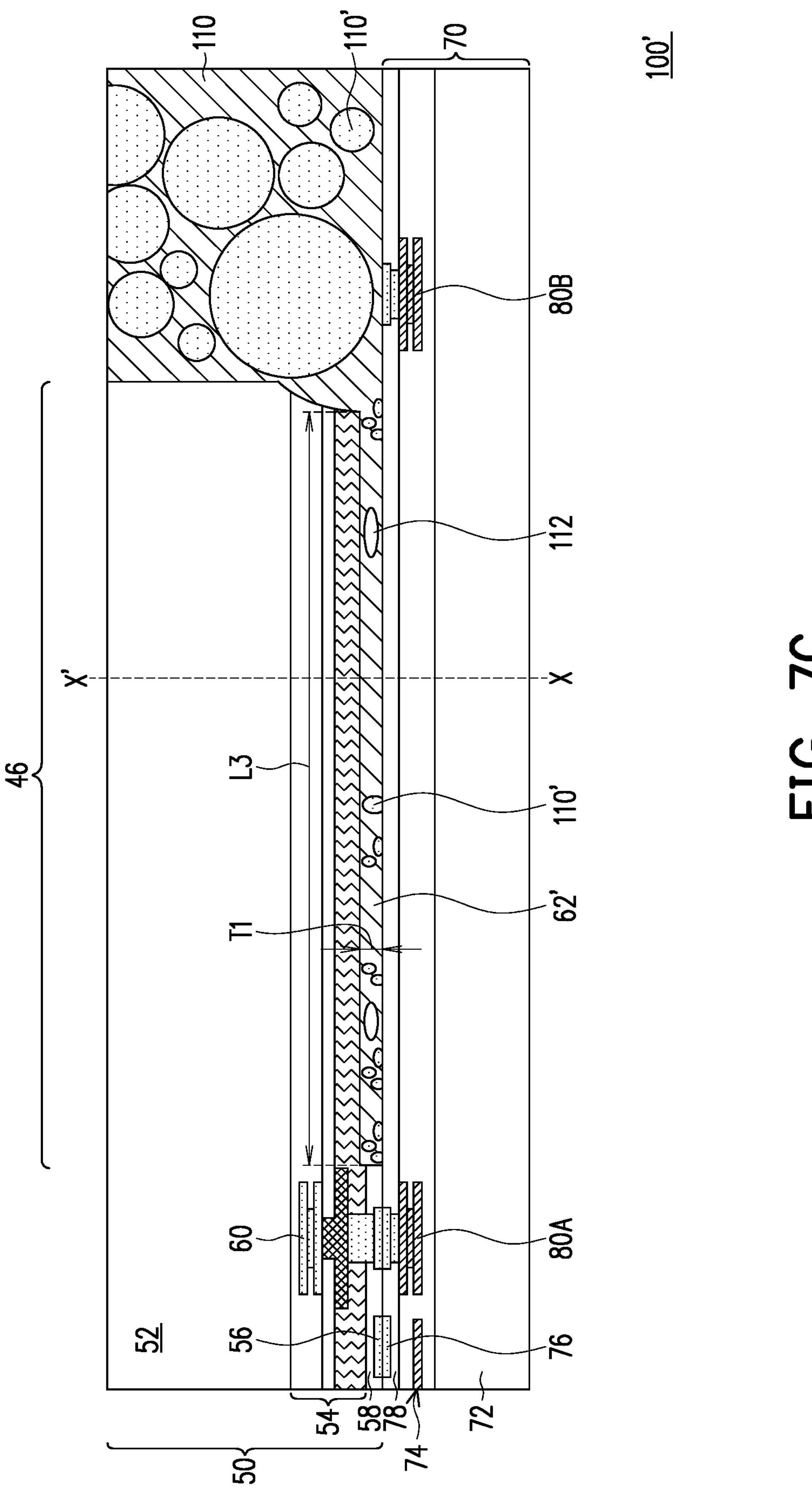
Figure 7D:
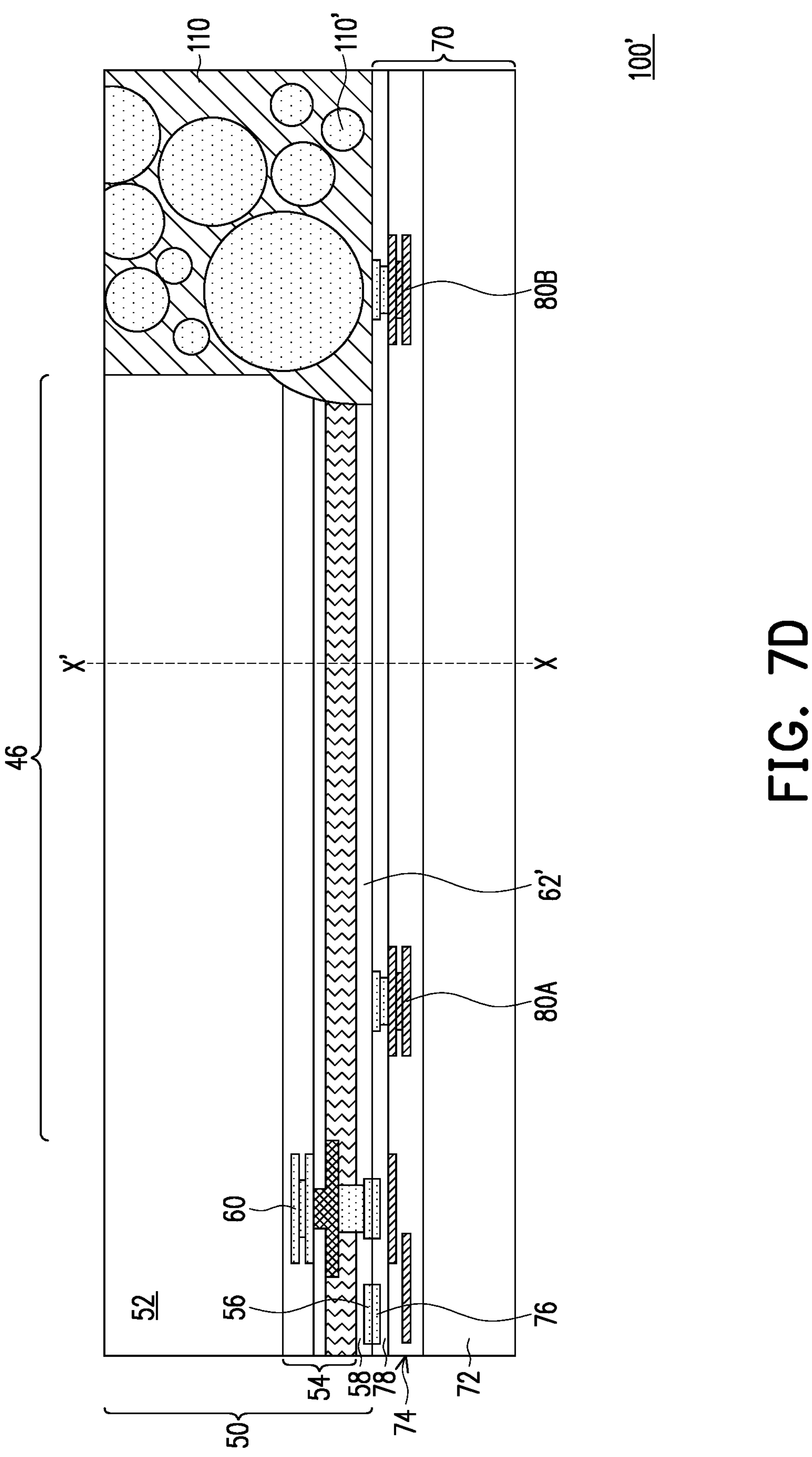

FIGS. 7B through 7D illustrate detailed, cross-sectional views of region 100' of FIG. 7A according to various embodiments. In each of the embodiments of FIGS. 7B through 7D, the integrated circuit dies 50 overlaps the seal ring 80A, and the seal ring 80B is disposed outside of an area overlapped by the integrated circuit dies 50. FIGS. 7B and 7C illustrates embodiments where the ledge 62' is included in the integrated circuit dies 50. Specifically, FIG. 7B illustrates an embodiment where the seal ring 80A is laterally displaced from the seal ring 60, and FIG. 7C illustrates an embodiment where the seal ring 60 overlaps and is aligned with the seal ring 80A. In the embodiments of FIGS. 7B and 7C, the encapsulant 110 extends between the insulating bonding layers 58, 78 in the ledge 62' along a line X-X' that is perpendicular to major surfaces of the substrates 52, 72. In this manner, the encapsulant 110 may be used as an adhesive to improve adhesion between the insulating bonding layers 58, 78 and reduce delamination defects. The encapsulant 110 may extend laterally from a sidewall of the insulating bonding layer 58 to an outer sidewall of the semiconductor substrate 52. In some embodiments, the fillers 110' of the encapsulant 110 may be also be disposed between the insulating bonding layers 58, 78 along the line X-X'. Further, because of the relatively small size of the ledges 62', voids 112 (e.g., internal seams and/or air gaps) may be formed in the encapsulant 110 between the insulating bonding layers 58, 78 along the line X-X' as part of the filling process to dispense the encapsulant 110 into the ledges 62'. Specific to the embodiment of FIG. 7B, the seal ring 80A may be overlapped by the ledge 62' and the portion of the encapsulant 110 between the insulating bonding layers 58, 78.

In the embodiments of FIGS. 7B and 7C, dimensions of the encapsulant 110 between the insulating bonding layers 58, 78 correspond to dimensions of the ledge 62'. For example, a thickness T1 of the encapsulant 110 between the insulating bonding layers 58, 78 may be equal to the depth D1 of the recess 62/ledge 62' (see FIG. 2), and the thickness T1 may be in a range of 5 kÅ to 2.5 μm. Further, the lateral dimension L3 of the encapsulant 110 between the insulating bonding layers 58, 78 may be in a range of 1 μm to 150 μm. It has been observed that when the dimensions of the encapsulant 110 between the insulating bonding layers 58, 78 is in the above ranges, adhesion between the integrated circuit dies 50 and the wafer 70 can be improved and stress accumulation and delamination defects can be reduced. Accordingly, semiconductor packages with reduced defects, improved reliability, and improved yield can be achieved.

In some embodiments, as illustrated by 7D, the ledge 62' is optional and may be omitted. In such embodiments, the encapsulant 110 may not extend between the insulating bonding layers 58, 78 along the line X-X'. For example, at the outer peripheries of the integrated circuit dies 50, the insulating layer 58 may be in physical contact with the insulating layer 78 without any intervening encapsulant 110. Although FIG. 7D illustrates an embodiment where the seal ring 80A is laterally displaced from the seal ring 60, the seal ring 80A may also be overlapped by the seal ring 60 in a similar manner as the embodiment of FIG. 7C but without the ledge 62'.

In should be understood that each of the embodiments of FIGS. 7B through 7D may be implemented in a single integrated circuit package. For example, multiple integrated circuit dies 50 are bonded to the wafer 70 in each of the package regions 100A, 100B. Accordingly, a first integrated circuit die 50 (e.g., die 50A) may have a first configuration according to any of embodiments of FIGS. 7B through 7D while a second integrated circuit die 50 (e.g., die 50B) may have a second configuration according to any of embodiments of FIGS. 7B through 7D. The second configuration of the second integrated circuit die (e.g., die 50B) could be the same or different from the first configuration of the first integrated circuit die 50 (e.g., die 50A).

Figure 8:
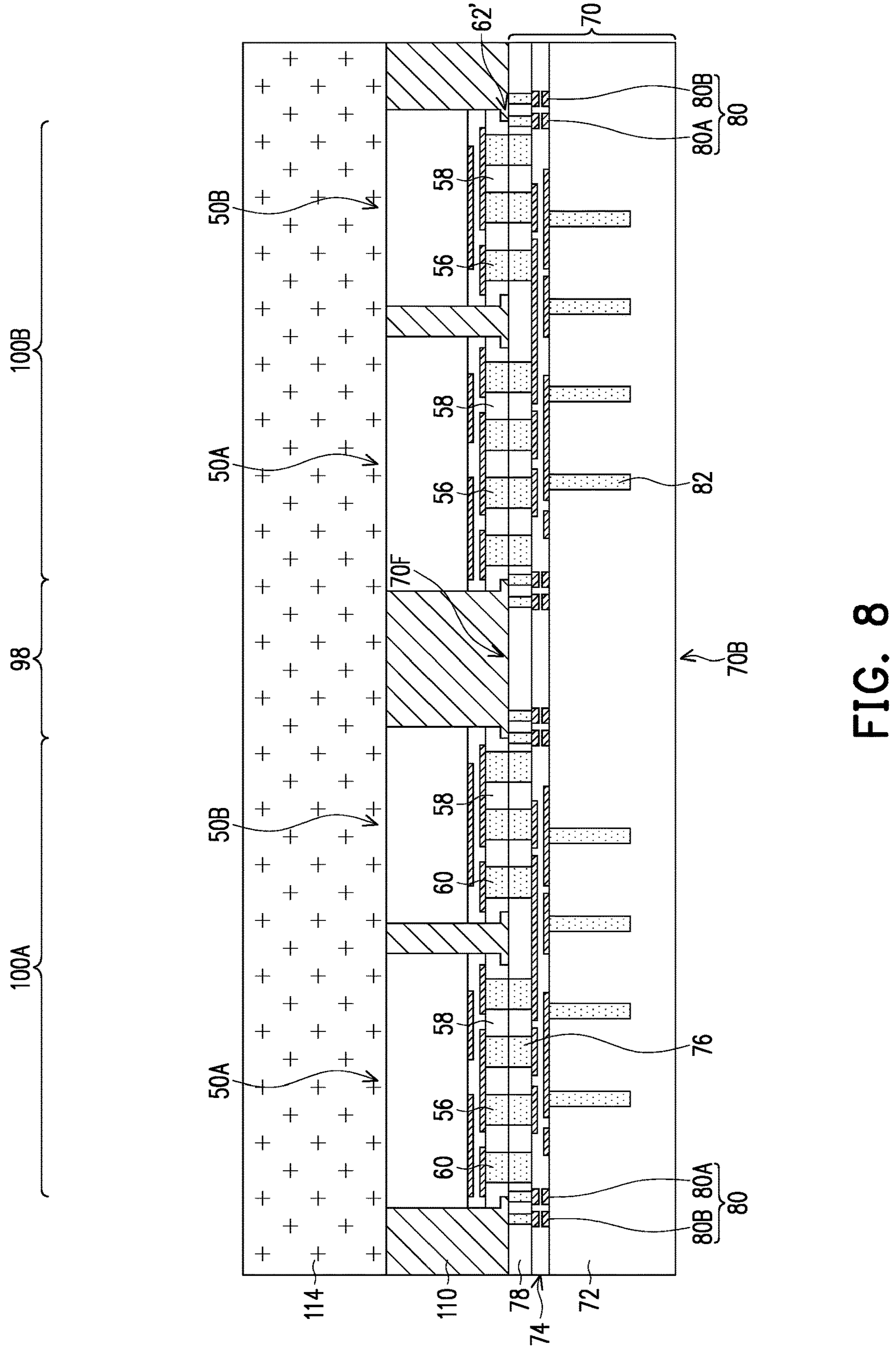

In FIG. 8, the intermediate structure is flipped over (not illustrated) to prepare for processing of the back side 70B of the substrate 72 (the side of the wafer 70 that is opposite to the front side 70F). The intermediate structure may be placed on a carrier substrate 114 or other suitable support structure for subsequent processing. For example, the carrier substrate 114 may be attached to the encapsulant 110 and the integrated circuit dies 50 by a release layer. The release layer may be formed of a polymer-based material, which may be removed along with the carrier substrate 114 from the structure after processing. In some embodiments, the carrier substrate 114 is a substrate such as a bulk semiconductor or a glass substrate. In some embodiments, the release layer is an epoxy-based thermal-release material, which loses its adhesive property when heated, such as a light-to-heat-conversion (LTHC) release coating.

Figure 9:
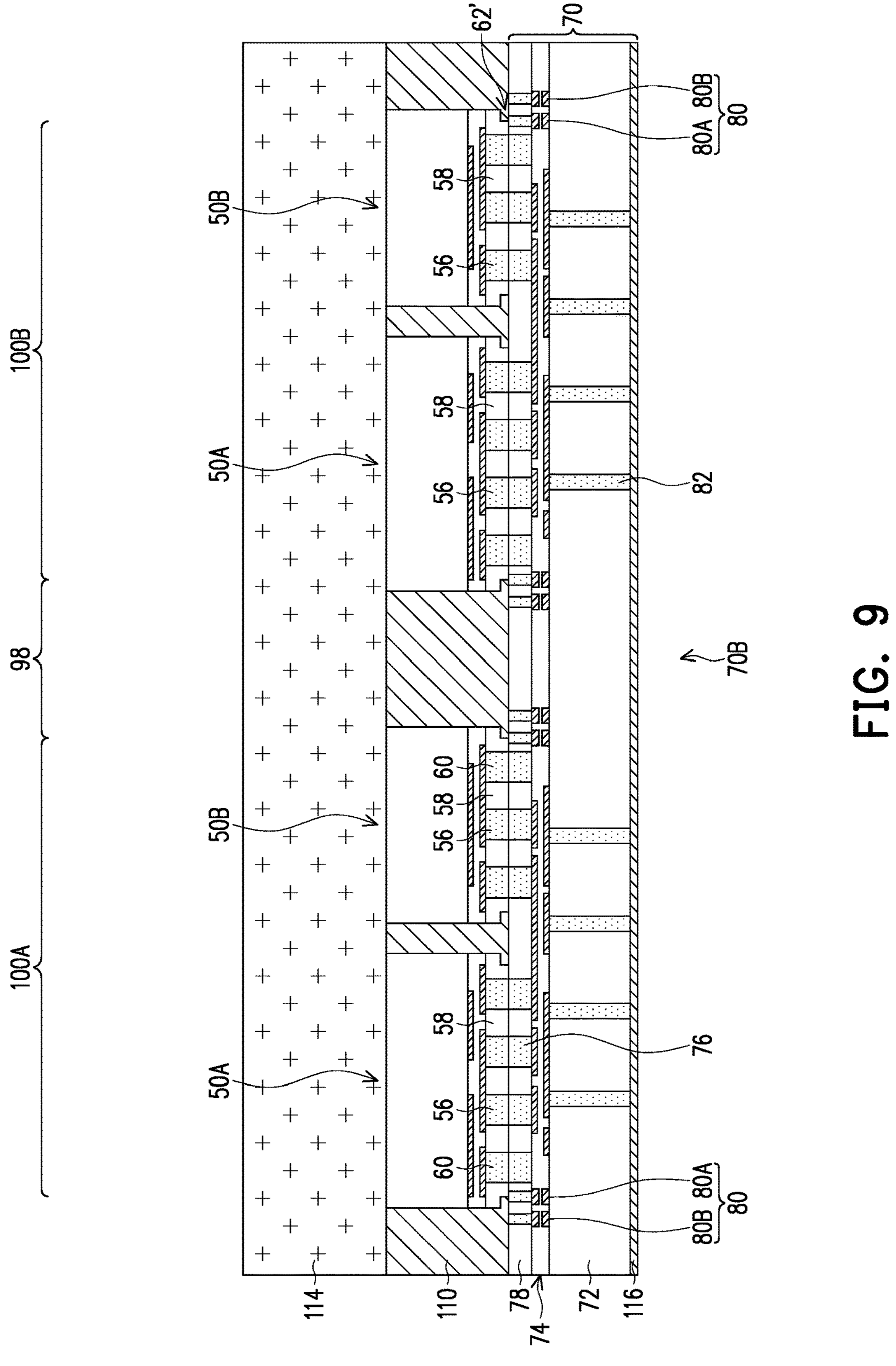

In FIG. 9, the substrate 72 is thinned to expose the conductive vias 82. Exposure of the conductive vias 82 may be accomplished by a thinning process, such as a grinding process, a CMP, an etch-back, combinations thereof, or the like. An insulating layer 116 is then formed on the back side 70B of the substrate 72, over the conductive vias 82. In some embodiments, the insulating layer 116 is formed from a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like.

Figure 10:
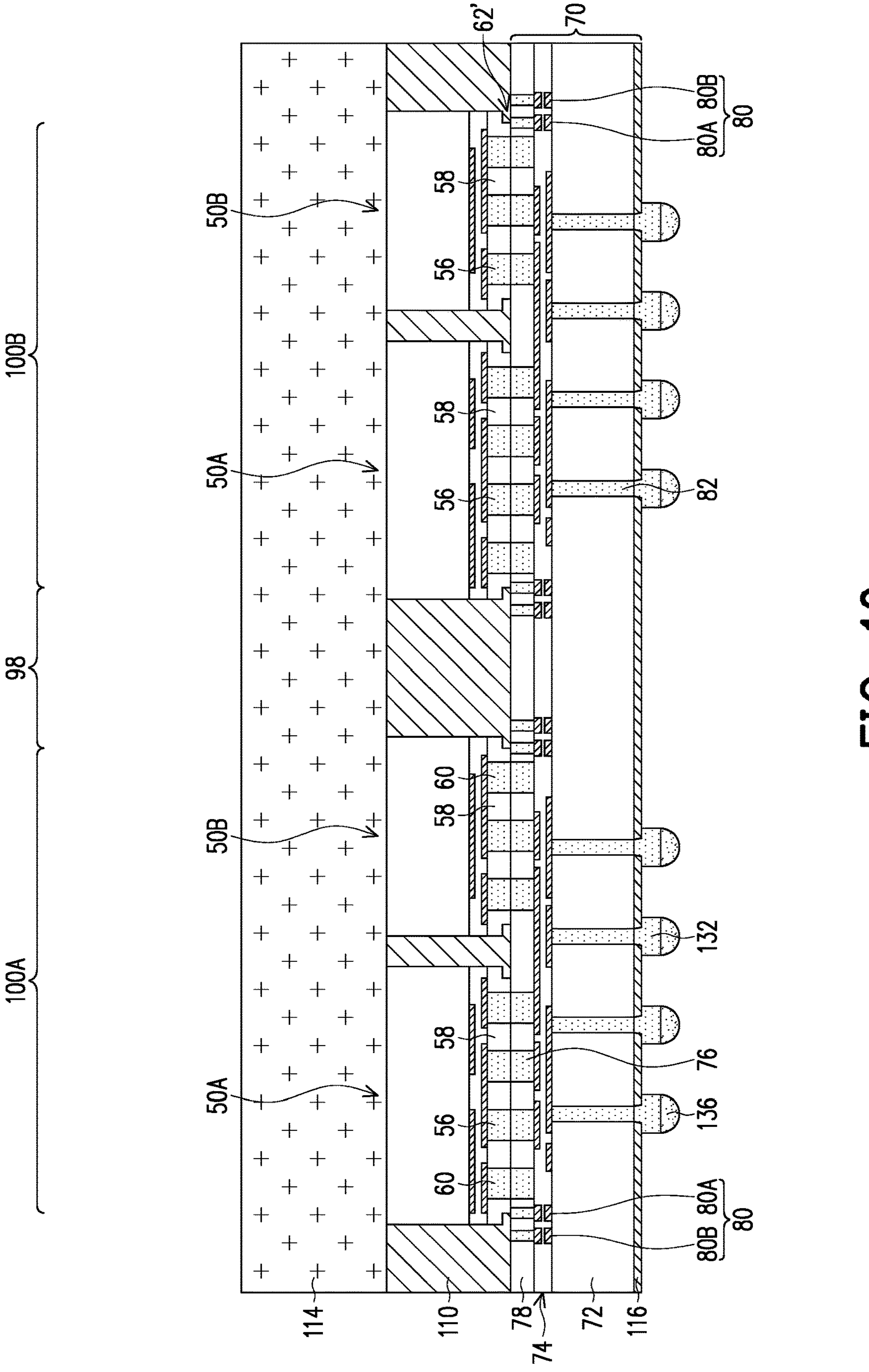

In FIG. 10, under bump metallurgies (UBMs) 132 are formed on and extending through the insulating layer 116. The UBMs 132 may be electrically connected to the conductive vias 82. As an example to form the UBMs 132, openings may be patterned in the insulating layer 116 to expose the conductive vias 82. Patterning the openings may be achieved by a combination of photolithography and etching in some embodiments. In other embodiments, the openings in the insulating layer 116 may be achieved by laser drilling, for example. A seed layer (not illustrated) is formed in the openings, such as over the exposed surfaces of the conductive vias 82 and the insulating layer 116. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 132. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 132.

Further, conductive connectors 136 are formed on the UBMs 132. The conductive connectors 136 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 136 may include a conductive material such as solder, copper, aluminum, gold, nickel, silver, palladium, tin, the like, or a combination thereof. In some embodiments, the conductive connectors 136 are formed by initially forming a layer of solder through evaporation, electroplating, printing, solder transfer, ball placement, or the like. Once a layer of solder has been formed on the structure, a reflow may be performed in order to shape the material into desired bump shapes. In another embodiment, the conductive connectors 136 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In FIG. 10, a carrier debonding is performed to detach (debond) the carrier substrate 114 from the encapsulant 110 and the integrated circuit dies 50. In embodiments where the carrier substrate 114 is attached to the encapsulant 110 and the integrated circuit dies 50 by a release layer, the debonding includes projecting a light such as a laser light or an ultraviolet (UV) light on the release layer so that the release layer decomposes under the heat of the light and the carrier substrate 114 can be removed. The structure is then flipped over and placed on a tape (not illustrated).

Figure 11A:
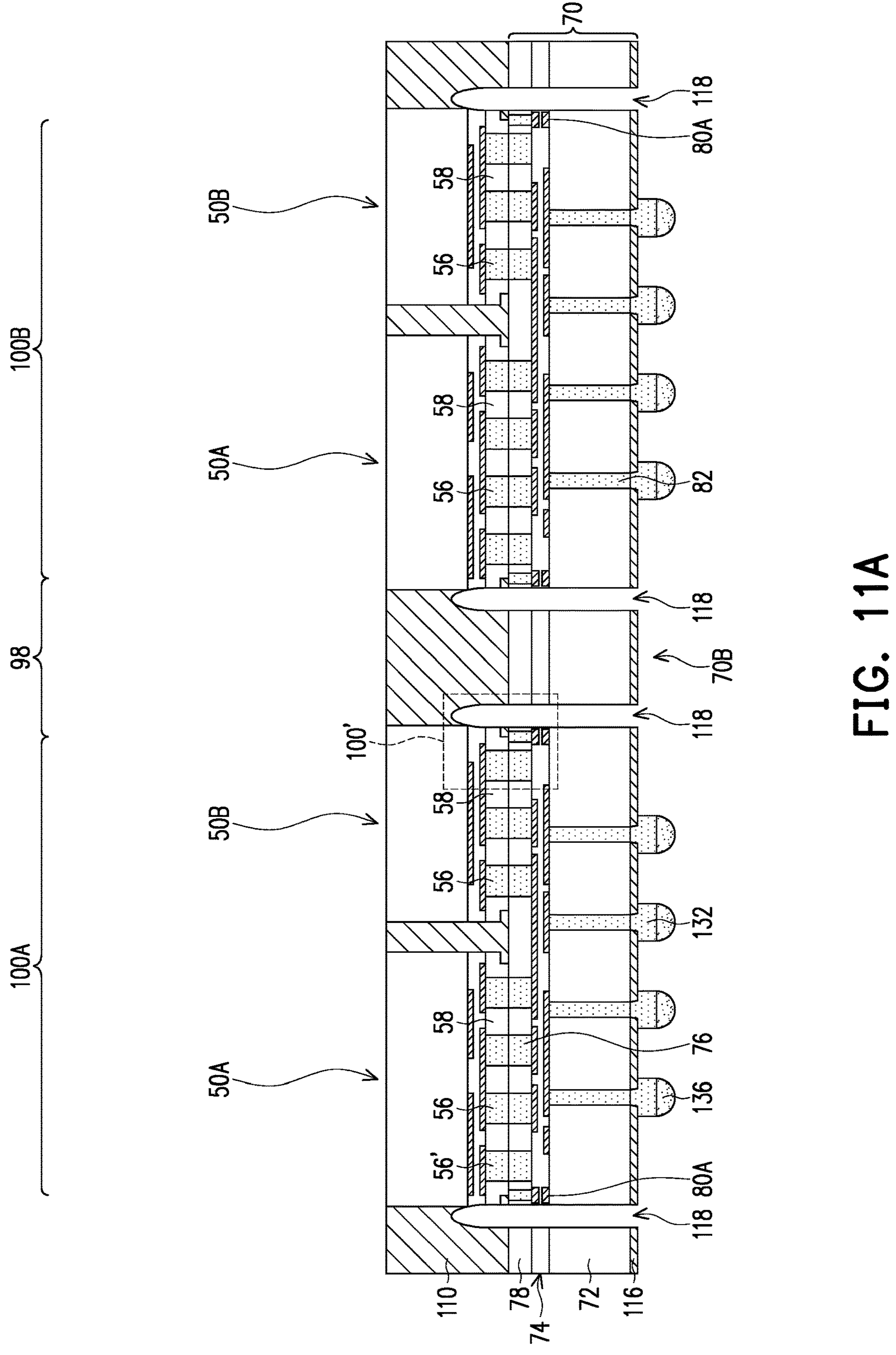
Figure 11B:
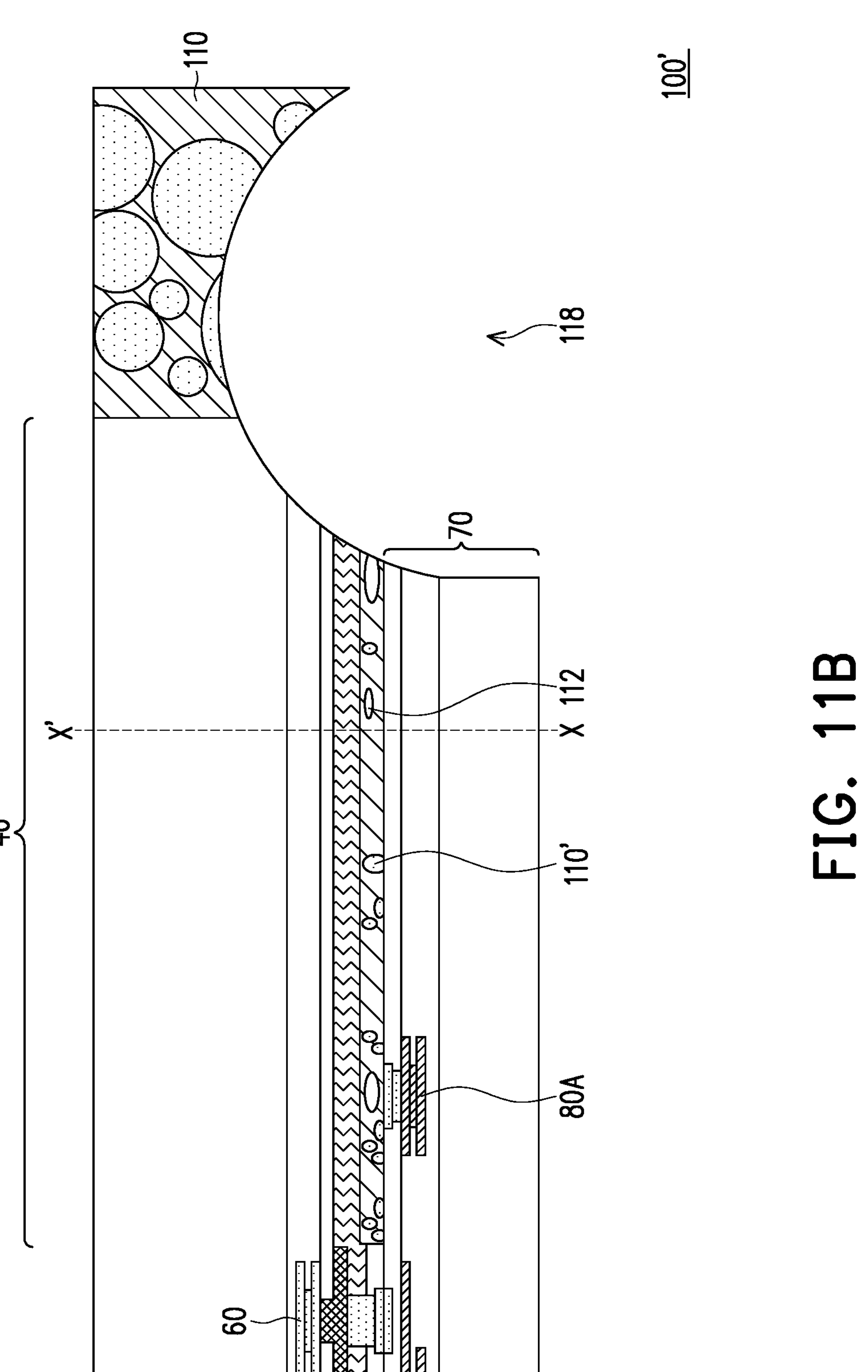

Subsequently, a singulation process is performed by cutting along scribe line regions 98, e.g., between the package regions 100A, 100B. FIGS. 11A through 12D illustrates this singulation process according to various embodiments. Referring to FIGS. 11A and 11B, a grooving process is performed to define a groove 118 in the scribe line region 98 between the package regions 100A, 100B. FIG. 11B illustrates a detailed view of the region 100' in FIG. 11A. In some embodiments, the grooving process may be a laser grooving process, a plasma dicing process (e.g., a deep plasma dicing process), or the like. The grooving process may be performed through the back side 70B of the wafer 70 regions between the seal rings 80A, 80B. For example, the grooving process may define grooves 118 that extends through the insulating layer 116 (see FIG. 11A, not illustrated in FIG.

11B), through the substrate 72, through the interconnect structure 74, through the bonding layer 78, through the encapsulant 110, and into the sacrificial zone 46 of the integrated circuit dies 50. Specifically, the grooving process may remove portions of the insulating bonding layer 58 (if present, see FIG. 7D), the interconnect structurer 54, and the substrate 52 in the sacrificial zone 46 at peripheries of the integrated circuit dies 50. In some embodiments, the grooving process may remove the seal ring 80B. In other embodiments, the grooving process may be contained between the seal rings 80A, 80B such that the grooves 118 are disposed between the seal rings 80A, 80B. In such embodiments, the seal ring 80B may remain in the wafer 70. Although FIG. 11B illustrates a detailed view that corresponds to the embodiment of FIG. 7B, it should be understood that the grooving process discussed may also be applied to the embodiments of FIG. 7C or 7D in other embodiments.

Figure 12A:
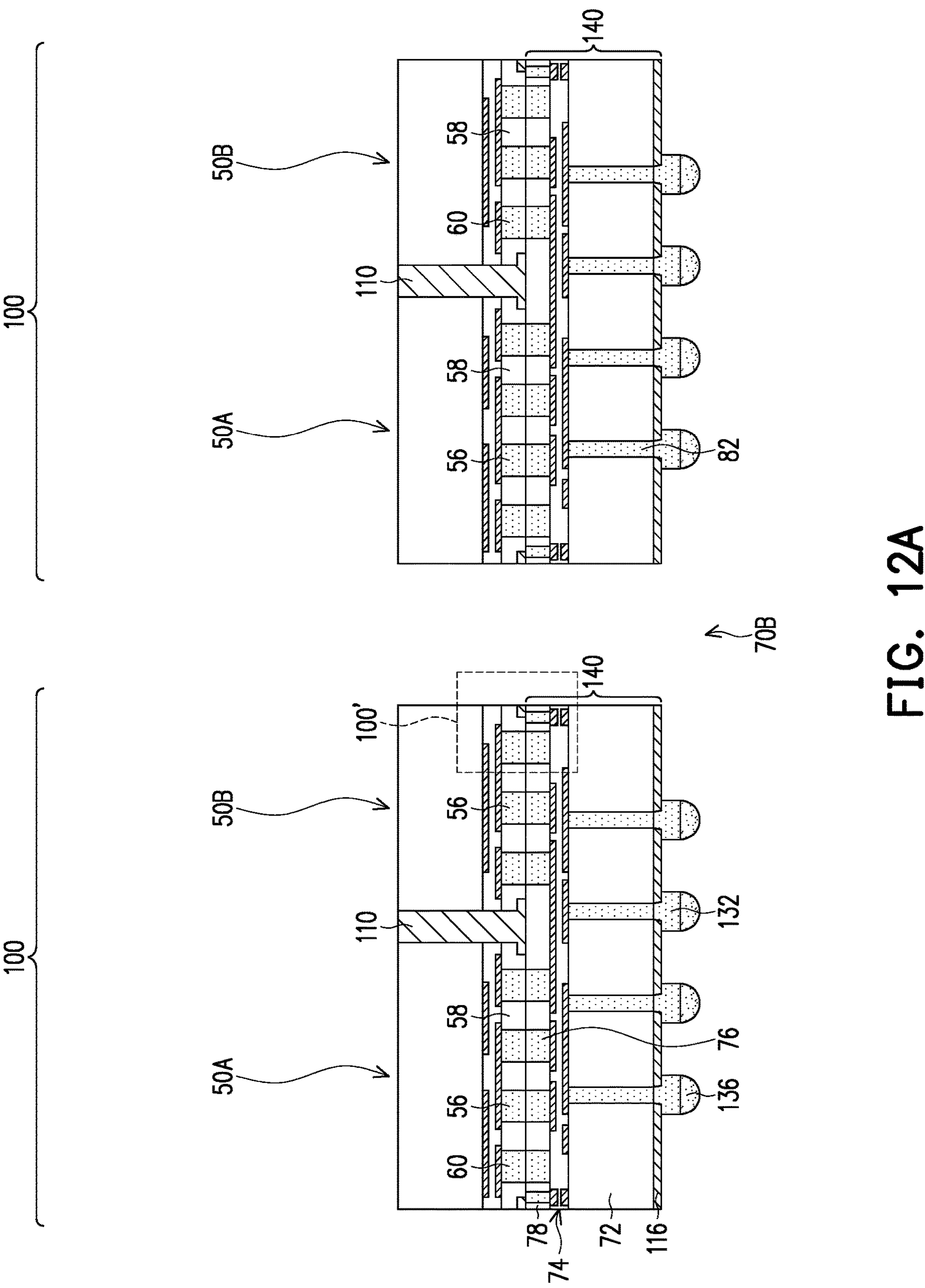
Figure 12B:
Figure 12B:
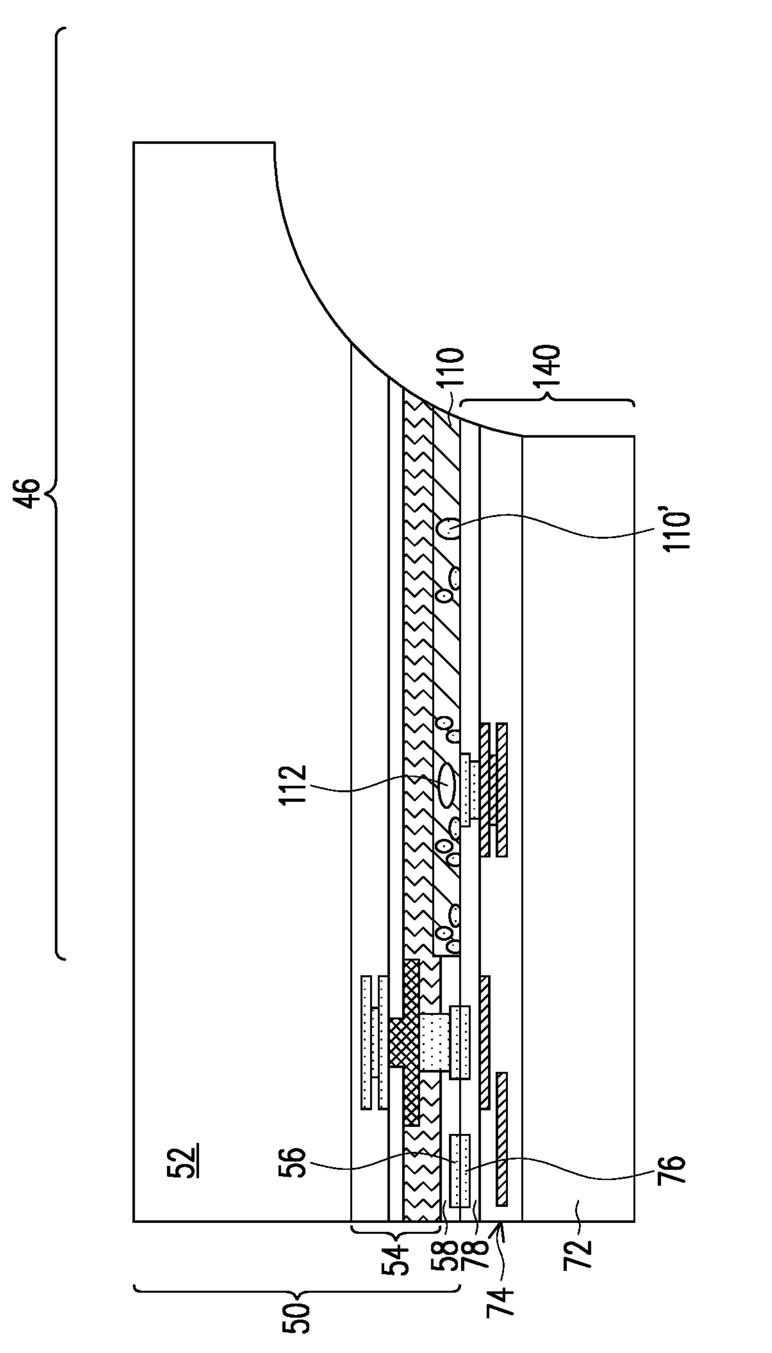
Figure 12C:
Figure 12C:
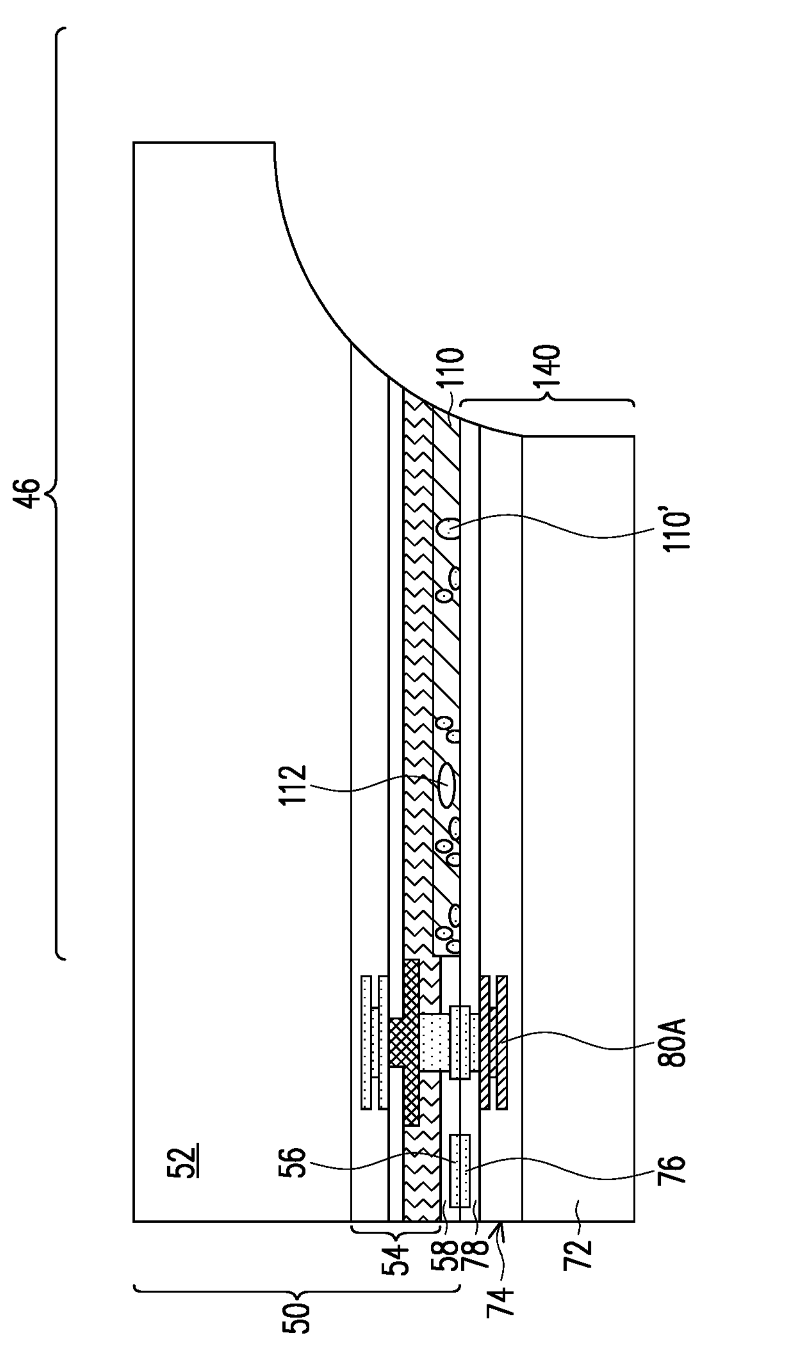
Figure 12D:
Figure 12D:
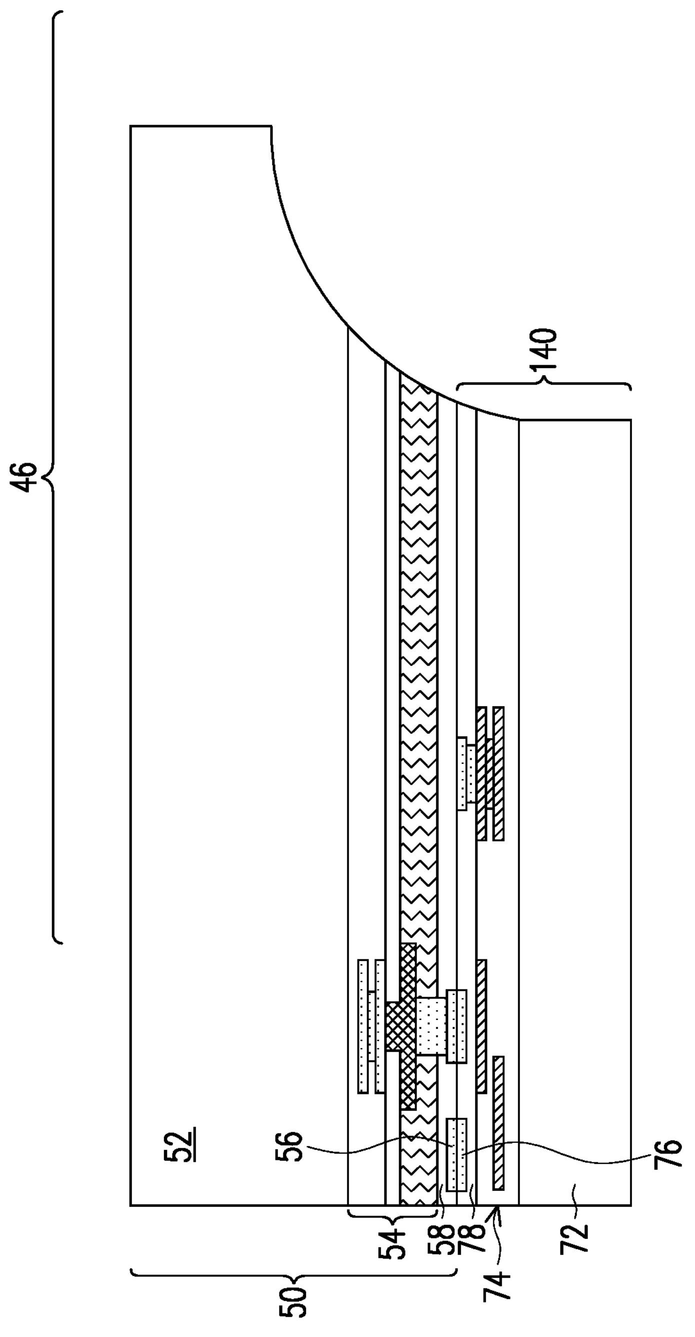
Figure 13A:
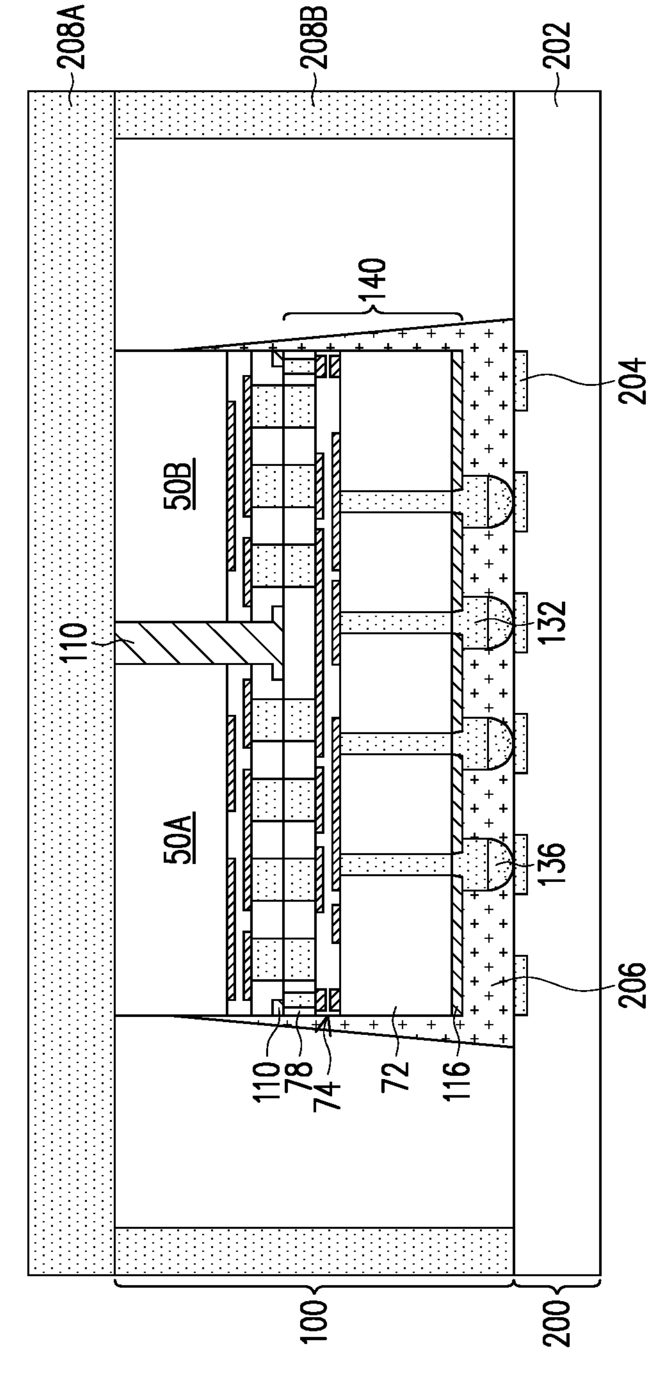
Figure 13B:
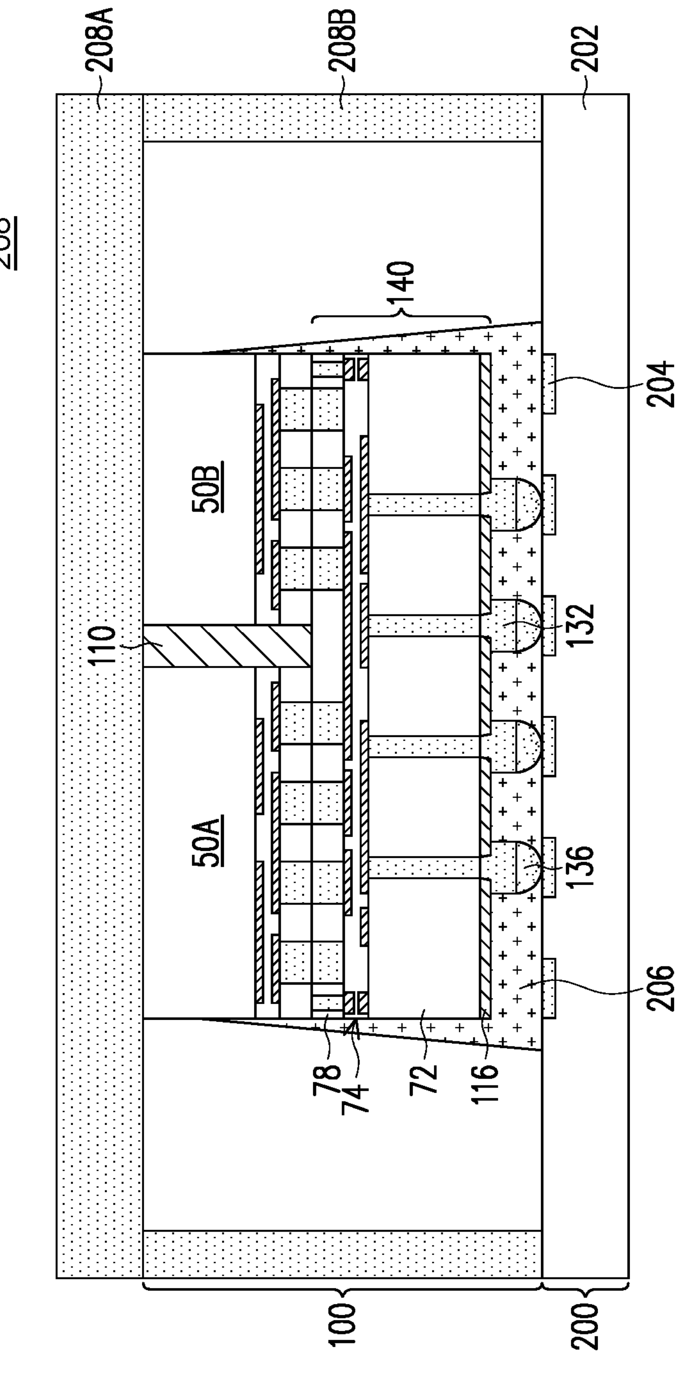

Then, in FIGS. 12A-12D, a sawing process is performed to fully separate the interposers 140 from each other and the wafer 70 to form an singulated, integrated circuit package 100. FIGS. 12B-12D illustrate detailed views of the region 100' in FIG. 12A. FIG. 12B corresponds to the embodiment of FIG. 7B; FIG. 12C corresponds to the embodiments of FIG. 7C; and FIG. 12D corresponds to the embodiments of FIG. 7D, each described above. In should be understood that each of the embodiments of FIGS. 12B through 12D may be implemented in a single integrated circuit package 100. For example, multiple integrated circuit dies 50 are bonded to the interposer 140 in each of the integrated circuit packages 100. Accordingly, a first integrated circuit die 50 (e.g., die 50A) may have a first configuration according to any of embodiments of FIGS. 12B through 12D while a second integrated circuit die 50 (e.g., die 50B) may have a second configuration according to any of embodiments of FIGS. 12B through 12D. The second configuration of the second integrated circuit die (e.g., die 50B) could be the same or different from the first configuration of the first integrated circuit die 50 (e.g., die 50A).

The sawing process may be performed through the grooves 118 in the scribe line region 98. In some embodiments, the sawing process is a mechanical process using a saw blade that is placed in the groove 118 to saw through the remaining semiconductor substrate 52 that is exposed by the groove 118. The singulation process singulates the package regions 100A, 100B from one another. The resulting, singulated integrated circuit package 100 is from one of the package regions 100A, 100B. The singulation process forms interposers 140 from the singulated portions of the wafer 70 and the insulating layer 116. The interposers 140 can be passive interposers free of active devices (e.g., transistors, diodes, or the like) or active interposers having active devices disposed therein. Each of the integrated circuit packages 100 includes an interposer 140. As a result of the singulation process, the integrated circuit dies 50 may overhang and extend laterally beyond the outer sidewalls of the interposer 140 (see FIGS. 12B-12D). The outer sidewalls of the interposer 140 and the integrated circuit dies 50 may be laterally coterminous (within process variations) in some embodiments.

The sawing process may be performed through the grooves 118 in the scribe line region 98. In some embodiments, the sawing process is a mechanical process using a saw blade that is placed in the groove 118 to saw through the remaining semiconductor substrate 52 that is exposed by the groove 118. The singulation process singulates the package regions 100A, 100B from one another. The resulting, singulated integrated circuit package 100 is from one of the package regions 100A, 100B. The singulation process forms interposers 140 from the singulated portions of the wafer 70 and the insulating layer 116. The interposers 140 can be passive interposers free of active devices (e.g., transistors, diodes, or the like) or active interposers having active devices disposed therein. Each of the integrated circuit packages 100 includes an interposer 140. As a result of the singulation process, the integrated circuit dies 50 may overhang and extend laterally beyond the outer sidewalls of the interposer 140 (see FIGS. 12B-12D). The outer sidewalls of the interposer 140 and the integrated circuit dies 50 and may be laterally coterminous (within process variations) in some embodiments.

Because the singulation process is performed through the integrated circuit dies 50, the encapsulant 110 around the peripheries of the integrated circuit dies 50 may be removed. Further, excess portions of the wafer 70 (e.g., areas directly under the encapsulant 110) can also be removed. For example, outer sidewalls of the integrated circuit package 100 may expose sidewalls of the integrated circuit dies 50 and sidewalls of the interposer 140. In some embodiments (see FIGS. 12B and 12C), the encapsulant 110 in the ledge 62' may be exposed at the outer sidewalls of the integrated circuit package 100. In embodiments where the ledge 62' is omitted (see FIG. 12D), the integrated circuit package 100 may include one or more outer sidewalls where no encapsulant 110 is exposed. In various embodiments, sidewalls of the integrated circuit dies 50 at the outer sidewalls of the integrated circuit package 100 may be free of any encapsulant 110 disposed thereon.

In this manner, the interposer 140 may be free of excess overhang. By reducing or eliminating excess overhang in the interposer 140, stress in the singulated, integrated circuit package 100 can be relaxed. For example, during operation of the integrated circuit package 100, different operating temperatures may result in undesired bending, particularly in the overhang regions of the interposers 140 (e.g., regions of the interposers 140 that extend beyond the integrated circuit dies 50). By removing excess overhang in the interposers 140, the undesired bending can be significantly reduced or even eliminated, thereby reducing stress in the integrated circuit package 100. It has been observed that stress can be reduced by up to 84% in high temperature operating conditions and reduced by up to 97% in low temperature operating conditions in packages that result from embodiment singulation methods.

In FIGS. 13A and 13B, the integrated circuit package 100 is then flipped and attached to a package substrate 200 using the conductive connectors 136. FIG. 13A illustrates embodiments where the ledges 62' are included, and FIG. 13B illustrates embodiments where the ledges 62' are excluded. The package substrate 200 includes a substrate core 202, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 202 may be a SOI substrate. Generally, an SOI substrate includes a layer of a semiconductor material such as epitaxial silicon, germanium, silicon germanium, SOI, SGOI, or combinations thereof. The substrate core 202 is, in one alternative embodiment, an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate core 202.

The substrate core 202 may include active and passive devices (not illustrated). Devices such as transistors, capacitors, resistors, combinations of these, and the like may be used to generate the structural and functional requirements of the design for the system. The devices may be formed using any suitable methods.

The substrate core 202 may also include metallization layers and vias (not illustrated) and bond pads 204 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material, and may be formed through any suitable process (such as deposition, damascene, dual damascene, or the like). In some embodiments, the substrate core 202 is substantially free of active and passive devices.

The conductive connectors 136 are reflowed to attach the UBMs 132 to the bond pads 204. The conductive connectors 136 connect the integrated circuit package 100, including metallization patterns of the interconnect structure 74, to the package substrate 200, including metallization layers in the substrate core 202. Thus, the package substrate 200 is electrically connected to the integrated circuit dies 50. In some embodiments, passive devices (e.g., surface mount devices (SMDs), not illustrated) may be attached to the integrated circuit package 100 (e.g., bonded to the UBMs 132) prior to mounting on the package substrate 200. In such embodiments, the passive devices may be bonded to a same surface of the integrated circuit package 100 as the conductive connectors 136. In some embodiments, passive devices (e.g., SMDs, not illustrated) may be attached to the package substrate 200, e.g., to the bond pads 204.

In some embodiments, an underfill 206 is formed between the integrated circuit package 100 and the package substrate 200, surrounding the conductive connectors 136 and the UBMs 132. The underfill 206 may be formed by a capillary flow process after the integrated circuit package 100 is attached or may be formed by a suitable deposition method before the integrated circuit package 100 is attached. The underfill 206 may be a continuous material extending from the package substrate 200 to the interposer 140 (e.g., the insulating layer 116). The underfill 206 may further extend along and physically contact sidewalls of the integrated circuit dies 50. In embodiments where the ledges 62' were included (FIG. 13A), the underfill may further physically contact sidewalls of the encapsulant 110 that is disposed between the insulating bonding layers 58, 78.

Optionally, a heat spreader 208 is attached to the integrated circuit package 100. The heat spreader 208 may be formed from a material with high thermal conductivity, such as steel, stainless steel, copper, the like, or combinations thereof. The heat spreader 208 may include a thermal lid 208A and a ring 208B, which may be attached to the integrated circuit package 100 by an adhesive or a thermal interface material (TIM). In some embodiments, the ring 208B may encircle the integrated circuit package 100 in a top down view. The heat spreader 208 protects the integrated circuit package 100 and forms a thermal pathway to conduct heat from the various components of the integrated circuit package 100 (e.g., the integrated circuit dies 50). The heat spreader 208 is in contact with the integrated circuit dies 50 and the encapsulant 110.

According to various embodiments, integrated circuit packages are formed by directly bonding integrated circuit dies to a wafer that contains another device, such as an interposer, and a molding compound is dispensed around the integrated circuit dies as an encapsulant. Then, a singulation process is performed that dices through the interposer and the integrated circuit dies. For example, sacrificial zones along peripheries of the integrated circuit dies and seal rings of the interposer may be included in the device designs such that no functional circuitry is formed in these sacrificial zones. The singulation process may then be performed to dice through the sacrificial zones and between seal rings of the interposer. In some embodiments, the sacrificial zone of the interposer may be defined by one or more seal rings, and at least one of the seal rings is disposed directly under the integrated circuit dies.

In this manner, a molding compound around an outer periphery of the integrated circuit dies and excess overhang of the interposer is removed, advantageously reducing stress in the resulting package. By reducing or eliminating excess overhang in the bottom interposer, stress in the bonded package can be relaxed (e.g., reducing undesired bending). It has been observed that stress can be reduced by up to 84% in high temperature operating conditions and reduced by up to 97% in low temperature operating conditions in packages that result from embodiment singulation methods.

In some embodiments, a package includes an integrated circuit die and an interposer. The integrated circuit die includes a first insulating bonding layer and a first semiconductor substrate. The interposer includes a second insulating bonding layer, a first seal ring, and a second semiconductor substrate, wherein the second insulating bonding layer is directly bonded to the first insulating bonding layer with dielectric-to-dielectric bonds. The integrated circuit die overlaps the first seal ring, and wherein a sidewall of the integrated circuit die is exposed at an outer sidewall of the package. In some embodiments, the integrated circuit die further comprises a second seal ring, and wherein the first seal ring is laterally displaced from the second seal ring. In some embodiments, a lateral distance between the first seal ring and the outer sidewall of the package is less than a lateral distance between the second seal ring and the outer sidewall of the package. In some embodiments, the integrated circuit die further comprises a second seal ring, and wherein the second seal ring overlaps the first seal ring. In some embodiments, the package further includes an encapsulant between the first insulating bonding layer and the second insulating bonding layer. In some embodiments, a sidewall of the encapsulant that is disposed between the first insulating bonding layer and the second insulating bonding layer is exposed at the outer sidewall of the package. In some embodiments, the integrated circuit die extends laterally beyond a sidewall of the interposer that is exposed at the outer sidewall of the package. In some embodiments, the interposer is bonded to a package substrate, wherein an underfill is disposed between the package and the package substrate, and wherein the underfill directly contacts the sidewall of the integrated circuit die.

In some embodiments, a method includes bonding a first integrated circuit die to an interposer, wherein the interposer comprises a first seal ring and a second seal ring; dispensing an encapsulant around the first integrated circuit die; and after dispensing the encapsulant, performing a singulation process on the interposer in a region between the first seal ring and the second seal ring to form a singulated package. The singulation process removes a portion of the first integrated circuit die, a first portion of the encapsulant on a sidewall of the first integrated circuit die, and a portion of the interposer between the first seal ring and the second seal ring. In some embodiments, the first integrated circuit die overlaps the first seal ring. In some embodiments, the method further includes bonding a second integrated circuit die to the interposer, wherein the second integrated circuit die overlaps the first seal ring, wherein dispensing the encapsulant comprises dispensing a second portion the encapsulant between the first integrated circuit die and the second integrated circuit die, and wherein the second portion of the encapsulant between the first integrated circuit die and the second integrated circuit die remains after the singulation process. In some embodiments, the encapsulant overlaps the second seal ring. In some embodiments, the first integrated circuit die comprises a third seal ring, and wherein the third seal ring defines a boundary of a sacrificial zone, and wherein the portion of the first integrated circuit die removed by the singulation process is in the sacrificial zone. In some embodiments, the method further includes bonding the singulated package to a substrate; and dispensing an underfill between the singulated package and the substrate, wherein the underfill physically contacts a sidewall of the interposer and a sidewall of the first integrated circuit die. In some embodiments, the singulation process includes a grooving process that forms a recess extending through the interposer and into a semiconductor substrate of the first integrated circuit die; and a sawing process that saws through remaining portions of the semiconductor substrate of the first integrated circuit die that is exposed by the recess. In some embodiments, the grooving process removes the second seal ring.

In some embodiments, a method includes bonding an integrated circuit die to an interposer, wherein the integrated circuit die comprises a first seal ring and a sacrificial zone between the first seal ring and an outer sidewall of the integrated circuit die, and wherein the interposer comprises a first seal ring; dispensing an encapsulant around the integrated circuit die; and performing a singulation process to form a singulated package. The singulation process is performed through the interposer and the sacrificial zone of the integrated circuit die, and after the singulation process, the integrated circuit die is exposed at an outer sidewall of the singulated package. In some embodiments, the interposer comprises a second seal ring, and wherein the integrated circuit die overlaps the second seal ring. In some embodiments, the first seal ring overlaps the second seal ring. In some embodiments, the interposer further comprises a third seal ring, and wherein the singulation process is performed in a region between the second seal ring and the third seal ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

bonding a first integrated circuit die to an interposer, wherein the interposer comprises a first seal ring and a second seal ring;

dispensing an encapsulant around the first integrated circuit die; and after dispensing the encapsulant, performing a singulation process on the interposer in a region between the first seal ring and the second seal ring to form a singulated package, wherein the singulation process removes a portion of the first integrated circuit die, a first portion of the encapsulant on a sidewall of the first integrated circuit die, and a portion of the interposer between the first seal ring and the second seal ring.

2. The method of claim 1, wherein the first integrated circuit die overlaps the first seal ring.

3. The method of claim 1 further comprising:

bonding a second integrated circuit die to the interposer, wherein the second integrated circuit die overlaps the first seal ring, wherein dispensing the encapsulant comprises dispensing a second portion of the encapsulant between the first integrated circuit die and the second integrated circuit die, and wherein the second portion of the encapsulant between the first integrated circuit die and the second integrated circuit die remains after the singulation process.

4. The method of claim 1, wherein the encapsulant overlaps the second seal ring.

5. The method of claim 1, wherein the first integrated circuit die comprises a third seal ring, and wherein the third seal ring defines a boundary of a sacrificial zone, and wherein the portion of the first integrated circuit die removed by the singulation process is in the sacrificial zone.

6. The method of claim 1, further comprising:

bonding the singulated package to a substrate; and dispensing an underfill between the singulated package and the substrate, wherein the underfill physically contacts a sidewall of the interposer and a sidewall of the first integrated circuit die.

7. The method of claim 1, wherein the singulation process comprises:

a grooving process that forms a recess extending through the interposer and into a semiconductor substrate of the first integrated circuit die; and a sawing process that saws through remaining portions of the semiconductor substrate of the first integrated circuit die that is exposed by the recess.

8. The method of claim 7, wherein the grooving process removes the second seal ring.

9. A method comprising:

bonding an integrated circuit die to an interposer, wherein the integrated circuit die comprises a first seal ring and a sacrificial zone between the first seal ring and an outer sidewall of the integrated circuit die;

dispensing an encapsulant around the integrated circuit die; and performing a singulation process to form a singulated package, wherein the singulation process is performed through the interposer and the sacrificial zone of the integrated circuit die, and wherein after the singulation process, the integrated circuit die is exposed at an outer sidewall of the singulated package.

10. The method of claim 9, wherein the interposer comprises a second seal ring, and wherein the integrated circuit die overlaps the second seal ring.

11. The method of claim 10, wherein the first seal ring overlaps the second seal ring.

12. The method of claim 10, wherein the interposer further comprises a third seal ring, and wherein the singulation process is performed in a region between the second seal ring and the third seal ring.

13. The method of claim 10, wherein performing the singulation process comprises performing a grooving process to define a groove extending from a surface of the interposer that is opposite to the integrated circuit die.

14. The method of claim 13, wherein the groove extends into a semiconductor substrate of the integrated circuit die.

15. A method comprising:

bonding a first integrated circuit die to an interposer, wherein the interposer comprises a first seal ring surrounding a first region of the interposer and a second seal ring surrounding the first seal ring, wherein the first integrated circuit die overlaps the first seal ring and the first region of the interposer;

bonding a second integrated circuit die to the interposer, wherein the second integrated circuit die overlaps the first region of the interposer and the first seal ring;

dispensing an encapsulant around the first integrated circuit die and the second integrated circuit die; and after dispensing the encapsulant, performing a singulation process on the interposer between the first seal ring and the second seal ring to form a singulated package, wherein the singulation process removes a portion of the first integrated circuit die, a first portion of the encapsulant on a sidewall of the first integrated circuit die, and a portion of the interposer between the first seal ring and the second seal ring.

16. The method of claim 15, wherein the first integrated circuit die overlaps the first seal ring.

17. The method of claim 15, wherein the encapsulant overlaps the second seal ring.

18. The method of claim 15, wherein the first integrated circuit die comprises a third seal ring, and wherein the third seal ring defines a boundary of a sacrificial zone, and wherein the portion of the first integrated circuit die removed by the singulation process is in the sacrificial zone.

19. The method of claim 18, wherein the third seal ring overlaps the first seal ring.

20. The method of claim 15, further comprising:

bonding the singulated package to a substrate; and dispensing an underfill between the singulated package and the substrate, wherein the underfill interfaces a sidewall of the first integrated circuit die.

* * * * *